US012572082B1

(12) United States Patent
Fujimura et al.

(10) Patent No.: US 12,572,082 B1
(45) Date of Patent: Mar. 10, 2026

(54) GEOMETRIC LOADING EFFECT CORRECTION FOR LITHOGRAPHY

(71) Applicant: D2S, Inc., San Jose, CA (US)

(72) Inventors: Akira Fujimura, Saratoga, CA (US); Abhishek Shendre, Fremont, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 19/180,769

(22) Filed: Apr. 16, 2025

Related U.S. Application Data

(60) Provisional application No. 63/737,970, filed on Dec. 23, 2024.

(51) Int. Cl.
| | |
|---|---|
| *G03F 7/20* | (2006.01) |
| *G03F 1/72* | (2012.01) |
| *G03F 7/00* | (2006.01) |

(52) U.S. Cl.
CPC ............ *G03F 7/70433* (2013.01); *G03F 1/72* (2013.01); *G03F 7/0005* (2013.01); *G03F 7/7005* (2013.01); *G03F 7/70558* (2013.01)

(58) Field of Classification Search
CPC ...... G03F 7/70433; G03F 1/72; G03F 7/0005; G03F 7/7005; G03F 7/70558
See application file for complete search history.

(56) References Cited

U.S. PATENT DOCUMENTS

| | | | |
|---|---|---|---|
| 7,608,845 B2 | 10/2009 | Abe et al. | |
| 10,444,629 B2 | 10/2019 | Zable | |
| 2003/0233630 A1 | 12/2003 | Sandstrom et al. | |
| 2015/0347660 A1 | 12/2015 | Platzgummer et al. | |
| 2017/0371246 A1* | 12/2017 | Zable ........................ | G03F 1/78 |
| 2020/0103764 A1* | 4/2020 | Tien ................... | G06F 30/3308 |
| 2020/0341380 A1* | 10/2020 | Zable ................... | G03F 7/2026 |
| 2021/0208507 A1 | 7/2021 | Wang et al. | |
| 2023/0124768 A1 | 4/2023 | Fujimura et al. | |

OTHER PUBLICATIONS

International Search Report and Written Opinion dated Sep. 8, 2025 for PCT Patent Application No. PCT/IB2025/054017.

* cited by examiner

*Primary Examiner* — Mesfin T Asfaw
(74) *Attorney, Agent, or Firm* — MLO, a professional corp.

(57) ABSTRACT

Methods and systems involve a plurality of patterns, each pattern in the plurality of patterns comprising a plurality of edges. Methods and systems also involve determining a neighborhood open area density for the plurality of patterns; determining a geometric loading effect correction, wherein the geometric loading effect correction comprises a calculated offset from an edge of a pattern in the plurality of patterns, and wherein the calculated offset is determined using the neighborhood open area density; and adjusting the edge of the pattern in the plurality of patterns using the geometric loading effect correction.

19 Claims, 14 Drawing Sheets

800

802 — Input plurality of patterns

805 — Pattern Information

810 — Determine neighborhood open area density

814 — Determine gLEC

816 — Adjust pattern edge

818 — Adjusted edges in pattern information

820 — Expose surface

GEOMETRIC LOADING EFFECT CORRECTION FOR LITHOGRAPHY

RELATED APPLICATIONS

This application claims priority to U.S. Provisional Patent Application No. 63/737,970, filed on Dec. 23, 2024, and entitled "Geometric Loading Effect Correction for Lithography"; the contents of which are hereby incorporated by reference in full.

BACKGROUND OF THE DISCLOSURE

In the production or manufacturing of semiconductor devices, such as integrated circuits, optical lithography may be used to fabricate the semiconductor devices. Optical lithography is a printing process in which a lithographic mask or photomask or reticle is used to transfer patterns to a substrate such as a semiconductor or silicon wafer to create the integrated circuit (I.C.). Other substrates could include flat panel displays, holographic masks or even other reticles. While conventional optical lithography uses a light source having a wavelength of 193 nm, extreme ultraviolet (EUV) and X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Conventional optical lithography writing machines typically reduce the photomask pattern by a factor of four during the optical lithographic process. Therefore, patterns formed on the reticle or mask are typically four times larger than the size of the desired pattern on the substrate or wafer.

SUMMARY

In some aspects, a method for semiconductor manufacture involves inputting a plurality of patterns, each pattern in the plurality of patterns comprising a plurality of edges. A neighborhood open area density is determined for the plurality of patterns. A geometric loading effect correction is determined, wherein the geometric loading effect correction comprises a calculated offset from an edge of a pattern in the plurality of patterns, and wherein the calculated offset is determined using the neighborhood open area density. The edge of the pattern in the plurality of patterns is adjusted using the geometric loading effect correction.

In some aspects, a system for semiconductor manufacture includes a device configured to receive a plurality of patterns, each pattern in the plurality of patterns comprising a plurality of edges; a device configured to determine a neighborhood open area density for the plurality of patterns; a device configured to determine a geometric loading effect correction, wherein the geometric loading effect correction comprises a calculated offset from an edge of a pattern in the plurality of patterns, and wherein the calculated offset is determined using the neighborhood open area density; and a device configured to adjust the edge of the pattern in the plurality of patterns using the geometric loading effect correction.

In some aspects, a method for manufacturing a semiconductor device includes determining a neighborhood open area density for a plurality of patterns, each pattern in the plurality of patterns comprising a plurality of edges. A geometric loading effect correction is determined, wherein the geometric loading effect correction comprises a calculated offset from an edge of a pattern in the plurality of patterns, and wherein the calculated offset is determined using the neighborhood open area density. The edge of the pattern in the plurality of patterns is adjusted using the geometric loading effect correction. The adjusted edge is formed on the semiconductor device.

BRIEF DESCRIPTION OF THE DRAWINGS

FIGS. 10A-10D describe contours for applying gLEC, in accordance with aspects of the present disclosure.

DETAILED DESCRIPTION

The present disclosure is related to lithography, and more particularly to the design and manufacture of a surface which may be the surface of a reticle, a wafer, or any other surface, using charged particle beam lithography. Although aspects shall be described in terms of a semiconductor wafer or a photomask, the methods and systems described herein can also be applied to other components used in the manufacturing of semiconductor devices. The aspects may also be applied to the manufacturing of various electronic devices such as flat panel displays, micro-electromechanical systems, and other microscopic structures that require precision by electron beam writing. Accordingly, a reference to exposure of a shape on a surface shall apply to, for example, a surface of a semiconductor wafer, or a surface of a reticle or photomask.

The present disclosure describes a geometric correction for loading effect in semiconductor manufacturing. Loading effect is an effect during the etching phase of mask processing influenced by 1 mm-scale density of an exposed area. Variable etch bias (VEB), another effect during the etching phase, is influenced by 10 nm-10 μm scale exposed areas adjacent to the contour edge being etched. The present disclosure describes correction methods for loading effect—not VEB. More specifically, in geometric loading effect correction ("gLEC") methods and systems, edges of a pattern to be printed are moved (i.e., adjusted) as a geometric correction by adjusting individual pixel doses. The gLEC is determined using a calculated offset that is based on neighborhood open area density. In contrast, conventional approaches for correcting for loading effect are dose-based, applying a uniform dose change for all edges. In conventional methods, even if a geometric analysis is used to determine the loading effect, the conventional methods applying a dose-based correction will result in non-optimal results. The present techniques of applying a geometric correction to loading effects improve accuracy of semiconductor patterns (shapes) compared to conventional loading effect correction techniques.

Lithography Systems

Figure 1:
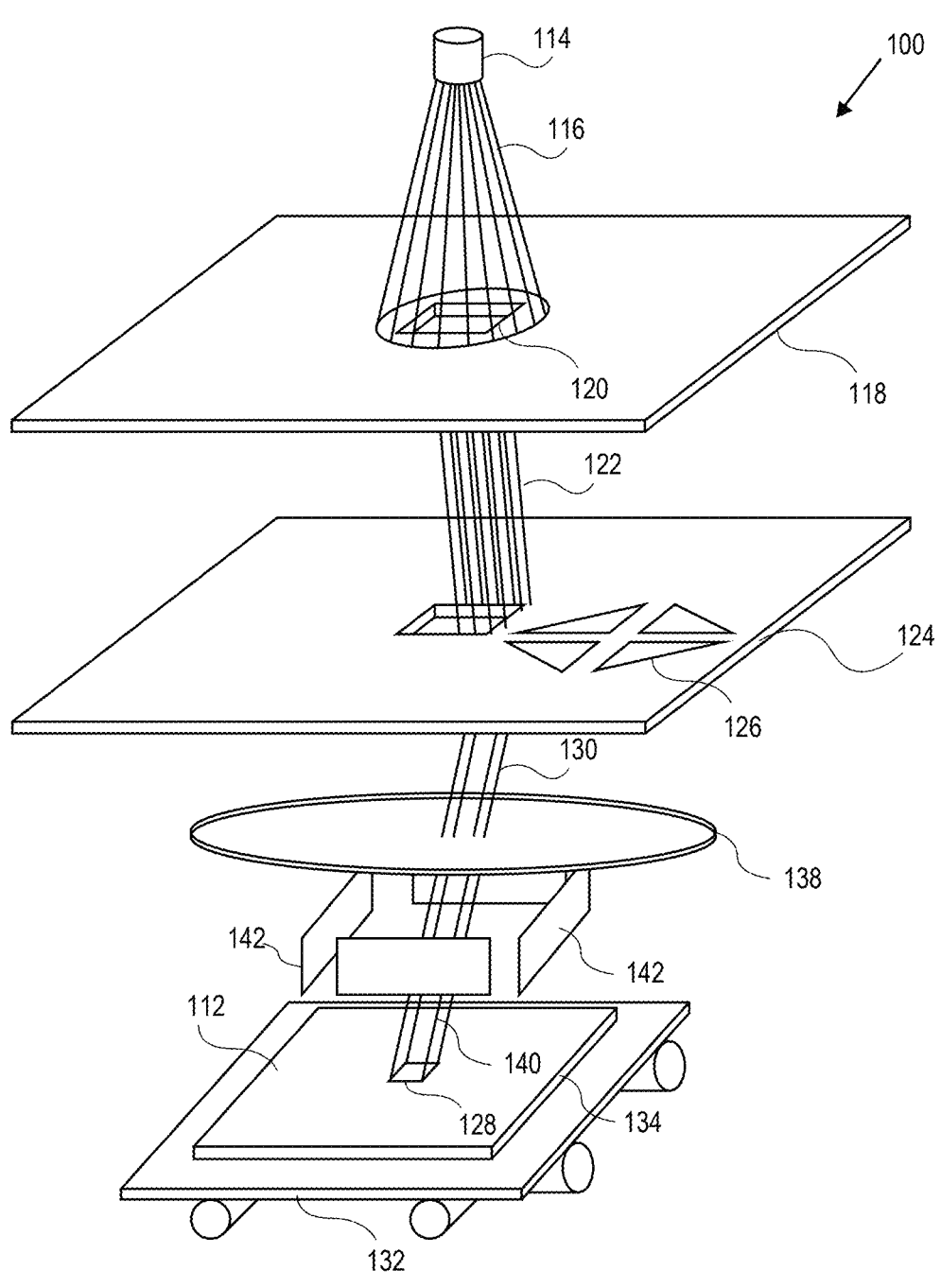
FIG. 1 illustrates an example of a variable shaped beam (VSB) charged particle beam system, as known in the art.

Referring now to the drawings, wherein like numbers refer to like items, FIG. 1 illustrates an embodiment of a lithography system, such as a charged particle beam writer system, in this case an electron beam writer system 100, that employs a variable shaped beam (VSB) to manufacture a surface 112. The electron beam writer system 100 has an electron beam source 114 that projects an electron beam 116 toward an aperture plate 118. The plate 118 has an aperture 120 formed therein which allows the electron beam 116 to pass. Once the electron beam 116 passes through the aperture 120 it is directed or deflected by a system of lenses (not shown) as electron beam 122 toward another rectangular aperture plate or stencil mask 124. The stencil 124 has formed therein a number of openings or apertures 126 that define various simple shapes such as rectangles and triangles. Each aperture 126 formed in the stencil 124 may be used to form a pattern in the surface 112 of a substrate 134, such as a silicon wafer, a reticle or other substrate. An electron beam 130 emerges from one of the apertures 126 and passes through an electromagnetic or electrostatic reduction lens 138, which reduces the size of the pattern emerging from the aperture 126. In commonly available charged particle beam writer systems, the reduction factor is between 10 and 60. The reduced electron beam 140 emerges from the reduction lens 138 and is directed by a series of deflectors 142 onto the surface 112 as a pattern 128. The surface 112 is coated with resist (not shown) which reacts with the electron beam 140. The electron beam 122 may be directed to overlap a variable portion of an aperture 126, affecting the size and shape of the pattern 128. Blanking plates (not shown) may be used to deflect the beam 116 or the shaped beam 122 so as to prevent the electron beam from reaching the surface 112 during a period after each shot when the lenses directing the beam 122 and the deflectors 142 are being re-adjusted for the succeeding shot. Stencil 124 may in itself act as a deflector by having the beam 116 be deflected to hit unopened portions of the stencil 124. Typically, the blanking plates are positioned so as to deflect the electron beam 116 to prevent it from illuminating aperture 120. Conventionally, the blanking period may be a fixed length of time, or it may vary depending, for example, on how much the deflector 142 must be re-adjusted for the position of the succeeding shot. Note that VSB systems can be thought of as a special (simple) case of character projection, where the characters are just simple characters, usually rectangles or 45-degree right triangles. It is also possible to partially expose a character. This can be done by, for instance, blocking part of the particle beam. In this disclosure, partial projection is used to mean both character projection and VSB projection.

In electron beam writer system 100, the substrate 134 is mounted on a movable platform or stage 132. The stage 132 allows substrate 134 to be repositioned so that patterns which are larger than the maximum deflection capability or field size of the charged particle beam 140 may be written to surface 112 in a series of subfields, where each subfield is within the capability of deflector 142 to deflect the beam 140. In one embodiment the substrate 134 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 128, generally reduced in size, onto a silicon wafer to produce an integrated circuit. More generally, the mask is used in another device or machine to transfer the pattern 128 on to a substrate (not illustrated).

The shot dosage of a charged particle beam writer such as an electron beam writer system, whether VSB, CP, or a multi-beam machine, is a function of the intensity of the beam source 114, in this VSB example, and the exposure time for each shot. Typically, the beam intensity remains fixed, and the exposure time is varied to obtain variable shot dosages. The exposure time may be varied to compensate for mid-range effects (called mid-range effect correction or MEC), various long-range effects such as loading-effect (called loading effect correction or LEC) and fogging-effect (fogging effect correction or FEC) and backscatter (addressed in a process called proximity effect correction or PEC). These effects vary in range but are all addressed by adjusting dose. Electron beam writer systems usually allow setting an overall dosage, called a base dosage, that affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems, all shots have the base dosage, before dose adjustment. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels. Some embodiments of the current disclosure are targeted for use with charged particle beam writing systems which allow assignment of dosage levels.

Figure 2:
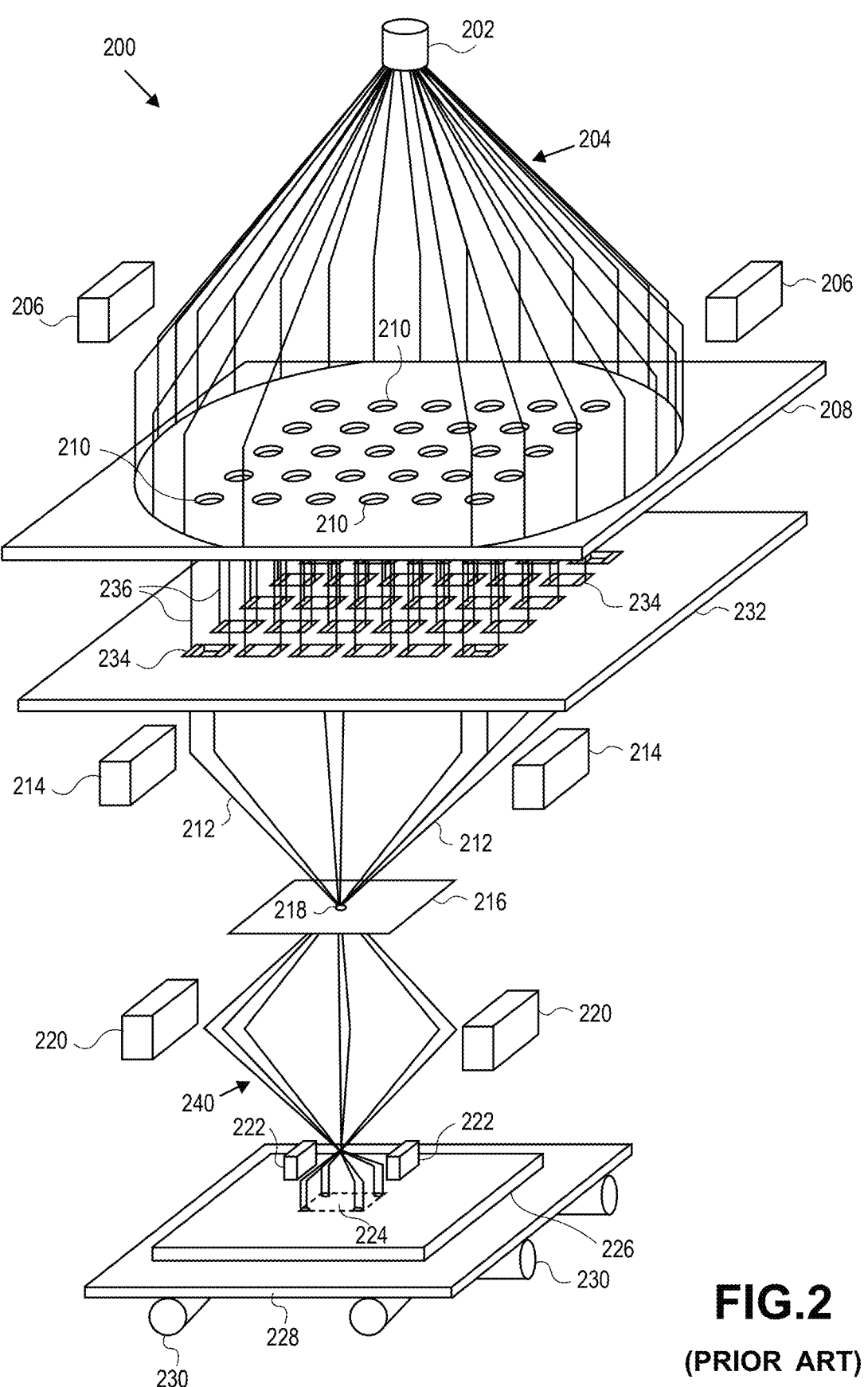
FIG. 2 illustrates an example of a multi-beam charged particle beam system, as known in the art.

FIG. 2 illustrates an example of a charged particle beam exposure system 200. Charged particle beam system 200 is a multi-beam system, in which a plurality of individually-controllable shaped beams can simultaneously expose a surface. Multi-beam system 200 has an electron beam source 202 that creates an electron beam 204. The electron beam 204 is directed toward aperture plate 208 by condenser 206, which may include electrostatic and/or magnetic elements. Aperture plate 208 has a plurality of apertures 210 which are illuminated by electron beam 204, and through which electron beam 204 passes to form a plurality of shaped beamlets 236. In some aspects, aperture plate 208 may have hundreds or thousands of apertures 210. Although FIG. 2 illustrates an example with a single electron beam source 202, in other examples apertures 210 may be illuminated by electrons from a plurality of electron beam sources. Apertures 210 may be rectangular, or may be of a different shape, for example circular. The set of beamlets 236 then illuminates a blanking controller plate 232. The blanking controller plate 232 has a plurality of blanking controllers 234, each of which is aligned with a beamlet 236. Each blanking controller 234 can individually control its associated beamlet 236, so as to either allow the beamlet 236 to strike surface 224, or to prevent the beamlet 236 from striking the surface 224. The amount of time for which the beam strikes the surface controls the total energy or "dose" applied by that beamlet. Therefore, the dose of each beamlet may be independently controlled.

In FIG. 2 beamlets that are allowed to strike surface 224 are illustrated as beamlets 212. In one aspect, the blanking controller 234 prevents its beamlet 236 from striking the surface 224 by deflecting beamlet 236 so that it is stopped by an aperture plate 216 which contains an aperture 218. In some aspects, blanking plate 232 may be directly adjacent to aperture plate 208. In other aspects, the relative locations of aperture plate 208 and blanking plate 232 may be reversed from the position illustrated in FIG. 2, so that beam 204 strikes the plurality of blanking controllers 234. A system of lenses comprising elements 214, 220, and 222 allows projection of the plurality of beamlets 212 onto surface 224 of substrate 226, typically at a reduced size compared to the plurality of apertures 210. The reduced-size beamlets form a beamlet group 240 which strikes the surface 224 to form a pattern that corresponds to the pattern of the apertures 210, which are allowed to strike surface 224 by blanking controllers 234. In FIG. 2, beamlet group 240 has four beamlets illustrated for forming a pattern on surface 224.

Substrate 226 is positioned on movable platform or stage 228, which can be repositioned using actuators 230. By moving stage 228, beamlet group 240 can expose an area larger than the dimensions of the maximum size pattern formed by beamlet group 240, using a plurality of exposures or shots. In some aspects, the stage 228 remains stationary during an exposure, and is then repositioned for a subsequent exposure. In other aspects, stage 228 moves continuously and at a variable velocity. In yet other aspects, stage 228 moves continuously but at a constant velocity, which can increase the accuracy of the stage positioning. For those aspects in which stage 228 moves continuously, a set of deflectors (not shown) may be used to move the beam to match the direction and velocity of stage 228, allowing the beamlet group 240 to remain stationary with respect to surface 224 during an exposure. In still other aspects of multi-beam systems, individual beamlets in a beamlet group may be deflected across surface 224 independently from other beamlets in the beamlet group. Other types of multi-beam systems may create a plurality of unshaped beamlets 236, such as by using a plurality of charged particle beam sources to create an array of Gaussian beamlets.

Figure 3:
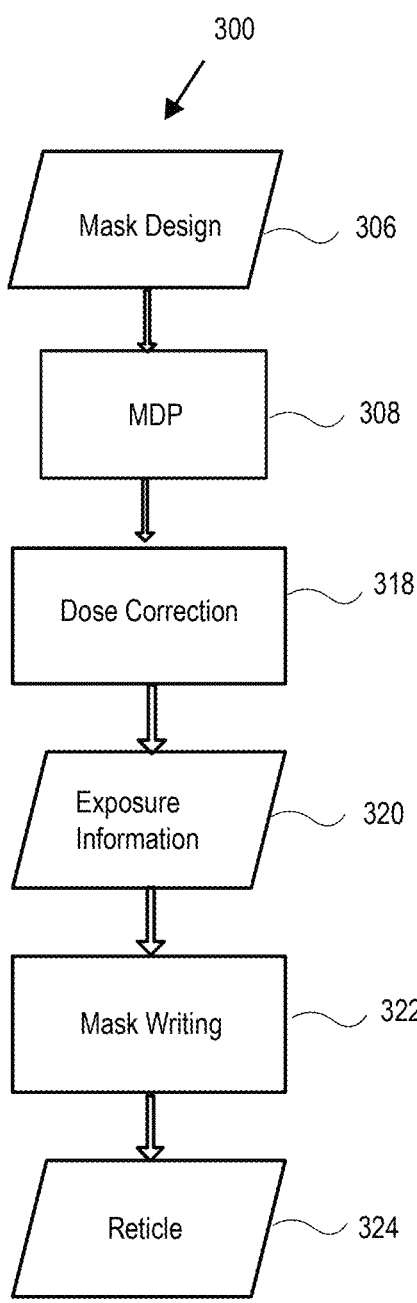
FIG. 3 illustrates a conceptual flow diagram for preparing a surface or reticle for use in fabricating a substrate such as an integrated circuit on a silicon wafer, as known in the art.

FIG. 3 is a conceptual flow diagram 300 for preparing a surface such as a reticle or other surface, using charged particle beam lithography, as known in the art. In a first step a mask design 306 is created. There may be multiple mask designs 306 for a given layer of a wafer. The mask design 306 may comprise a physical design, such as a physical design of an integrated circuit. The physical design may comprise logic gates, transistors, metal layers and other items that are required to be found in a physical design such as the physical design of an integrated circuit. Optical Proximity Correct (OPC) may be used to compute the mask shapes needed to best produce the desired wafer shapes across manufacturing variation. OPC alters the physical design to compensate for distortions caused by effects such as optical diffraction and the optical interaction of features with proximate features producing the mask design 306. In a step 308, a mask data preparation (MDP) operation may include a fracturing operation that takes the desired contiguous shape and divides it into constituent subshapes such as trapezoids or triangles, assigns dose to those subshapes, or divides shapes and subshapes into multiple partitions, and other operations. In some embodiments that are for multi-beam mask writing, MDP step 308 may include determining the pixel doses for each beamlet in each pass of multi-beam mask writing, then storing the pixel doses as exposure information 320 for the mask writer to use later. In multi-beam writing, however, the common practice is to rasterize the subshapes derived by MDP step 308, with exposure information 320 or step 322 rasterizing that data to generate the pixel dose map.

A dose correction may be performed in step 318, in which dosages are adjusted to account for backscatter, fogging, loading and other effects, creating an exposure information 320 with adjusted dosages. The adjusted dosages in exposure information 320 are used to generate a surface in a mask writing step 322, which uses a charged particle beam writer such as an electron beam writer system. Depending on the type of charged particle beam writer being used, the dose correction of step 318 may be performed by the charged particle beam writer. Mask writing step 322 may comprise a single exposure pass or multiple exposure passes. In the charged particle beam writer system, a precise electron beam is shaped and steered so as to expose a resist-coated surface, such as the surface of a wafer or the surface of a reticle 324 to form a pattern. Once the pattern has been formed, the surface may undergo a variety of other processes such as resist development, baking and etching. The completed surface may then be used in an optical lithography machine.

Conventional Loading Effect Correction

Loading Effect Correction (LEC) is done in every mask writing machine along with other correction mechanisms that similarly use a Gaussian kernel of varying sizes to correct for various mask manufacturing effects. Many of those other corrections such as Proximity Effect Correction (PEC) and Fogging Effect Correction (FEC) are corrections for electron beam scattering effects (in and under the resist coating on the mask or above the mask surface). In either case, other exposures from a broader area have a side effect of "pre-dosing" the resist coating around the intended area of exposure for a particular shape. The broader areas of all shapes projected add up significantly enough to affect every shape that is intended to be printed on the mask. In the case of PEC, the broad area is typically modeled in approximately the 50 nm to 200 nm sigma range of a Gaussian distribution. In the case of FEC, the broad area is typically modeled in approximately the 800 microns to 2 mm range of a Gaussian distribution. The scattering in the case of FEC is much more diffused than for PEC. However, the collective sum of all such scatterings (from FEC and PEC) that occur for exposure for every single shape is large enough to make a significant "pre-dosing." Mask writers correct for these effects by computing the amount of electron dose cast in any given neighborhood, typically in appropriately diffused larger computing pixels, by each of these effects, and account for those pre-dosing effects by adjusting the amount of dose used for each shape so that the shapes printed will print at the right size despite the pre-dosing. Pre-dosing may occur, in time sequence, before or after the resist is exposed to print a shape.

LEC is also computed in all commercial mask writers similarly. But in the case of LEC, the effect being corrected for is not an electron dose-based effect. It is a loading effect which is a function of the neighborhood open area density in a 1 mm-scale on the mask, unrelated to electron dose. An open area on the surface is the area that is etched away. For a positive resist, the exposed area is the shape, and the shape is the area that is etched away. For a negative resist, the exposed area surrounds the shape, and the shape is the area that is etched away. In the mask making process, after the resist is exposed by dose, there are development, bake, etching and other processing steps where loading effect determines in a 1 mm-scale neighborhood how much a given edge of a shape is affected, depending on the shape density in the 1 mm-scale neighborhood. Because the loading effect acts over a very large range, the effect biases the edges of contours in a 100 μm neighborhood similarly. Looking at a 100 μm neighborhood of shapes, the biases induced by loading effect are nearly constant everywhere. The loading effect is not directly related to how much electron dose was used to generate that shape density.

Figure 4:
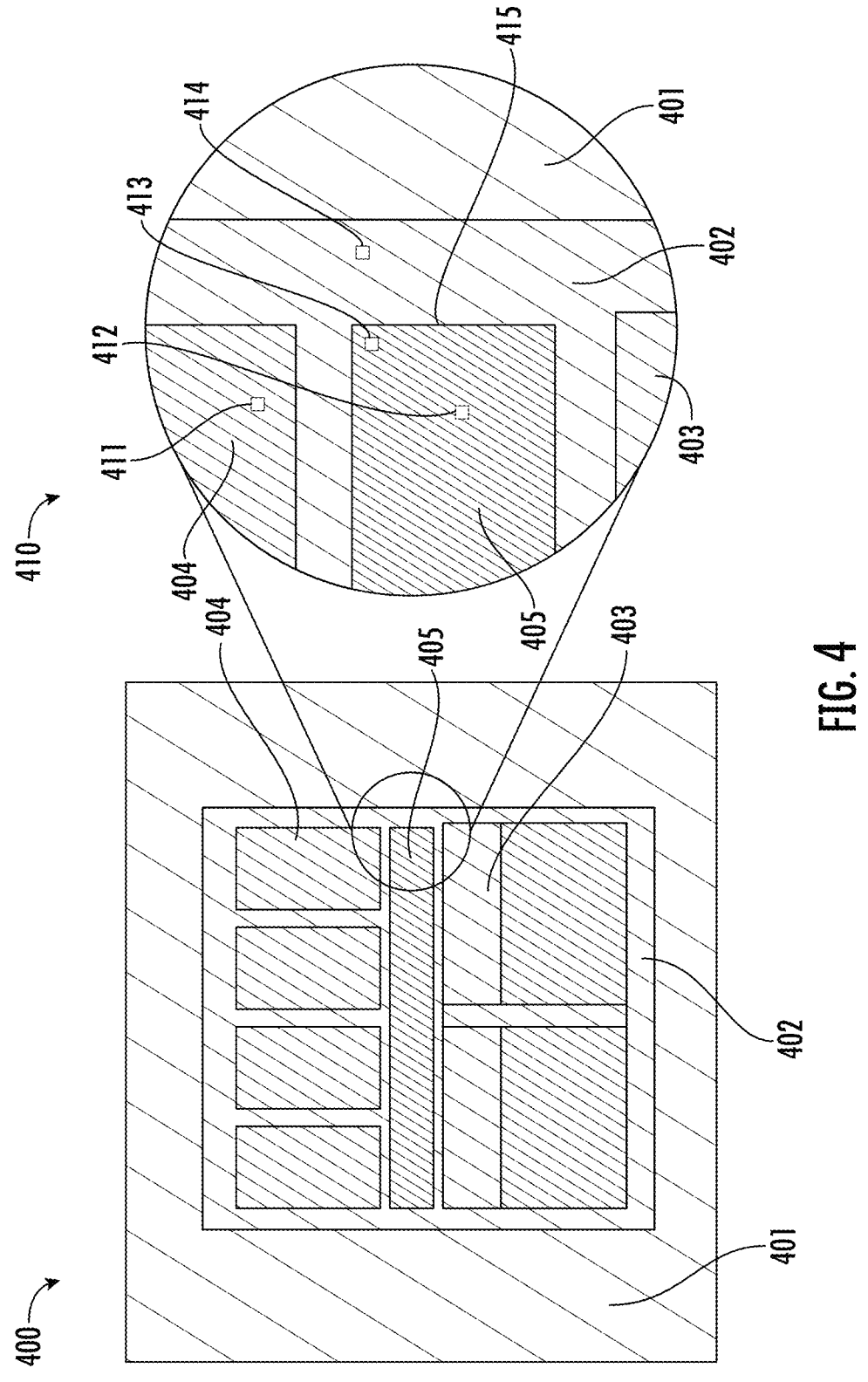
FIG. 4 illustrates how pattern density relates to loading effect.

FIG. 4 illustrates how loading effect biases an edge of a shape on the mask differently depending on the pattern density of its 1 mm-scale neighborhood. That is, the same pattern in different density areas will etch differently (e.g., 2 nm to 4 nm scale per edge). Mask 400 is shown with various different neighborhood open area densities as indicated by the hash density levels of areas 401, 402, 403, 404 and 405: very low density area 401, light density area 402, medium-light density area 403, medium density area 404, and high density area 405. In this example, the LEC scale (~1 mm) pattern density varies between areas 401 to 405. An enlarged view of a circled area 410, whose diameter is about 5 mm for this example, is indicated for mask 400, illustrating an example neighborhood of open area densities. When a mask design contains identical shapes to be produced on the mask in different locations, they are expected to be produced nearly the same everywhere with some tolerances for manufacturing variation. So, if an instance of a given shape of a given size is to be produced on mask 400 at locations 411, 412, 413, and 414, these four instances of the given shape should come out the same shape and same size, within the tolerances.

There are many factors that contribute to making the four instances (locations 411, 412, 413, and 414) come out differently in the different locations in a manufacturing process including short-range blur, mid-range blur, variable bias effect, backscatter-based proximity-effect, fogging effect, charging effect, and other effects in addition to loading effects. Loading effect correction attempts to isolate loading effects to correct for that, while other correction mechanisms account for other effects. Since making corrections for any given effect affects the particle beam cast on the resist of the surface, each type of correction mechanism needs to account for that type of effect itself and also corrections for other effects. These are accounted for through estimation, iteration, or by sequencing the corrections, or any combination thereof. In areas where the target mask shape is assumed to be achievable without corrections, such accounting may not be necessary. For example, for estimating the loading effect that is a function of its neighborhood open area density, a neighborhood open area density indicated by a target mask design may be used to approximate the actual neighborhood open area density of the produced mask, or some correction function may be used to improve the approximation.

In the example illustrated in FIG. 4, an instance of a shape at location 411 is on the corner of medium density area 404, and next to a light density area 402 which is to the right of the corner of medium density area 404. Light density area 402 in the area 410 is next to high density area 405 below, and very low density area 401 to the right. For the instances of the shape in the circular area 410, the neighborhood open area density as seen by the instance of the shape at location 411 can be determined; and similarly for locations 412, 413 and 414, and every other instance everywhere. Loading effect experienced by the instance of the shape at location 412, which is in high density area 405, is greater than that experienced by the instance of the shape at location 411 (in medium density area 404) due to the greater pattern density. Similarly, loading effect experienced by the instance of the shape at location 411 is greater than that experienced at location 414, which is in light density area 402. Consider the instances of the shape in locations 412 and 413 are both inside the high density area 405. A border 415 is between high density area 405 and adjacent light density area 402. The instance of the shape at location 413 is nearer to the border 415 than is the instance of the shape at location 412. Therefore, the loading effect on the instance of the shape at location 413 is less than that of the instance of the shape at location 412. Determining whether the instance of the shape at location 413 receives more or less loading effect than the instance of the shape at location 411 requires calculating the neighborhood open area density. Both dose-based and geometry-based LEC include a step of calculating the neighborhood open area density. Thus, the task of loading effect correction is to adjust for different loading conditions for all shapes in all locations throughout the mask 400.

Various mask manufacturing process steps act on the curvilinear contours generated on the resist after beam and resist blur acts on the areas of the resist on the surface exposed by the particle beams. These exposed contours are curves even if the exposure designated by the mask design are Manhattan shapes (axis-parallel vertical or horizontal edges, occasionally augmented by 45-degree angles to the axis). As VSB writing mostly exposes Manhattan shapes, VSB writers tend to write Manhattan target mask shapes. Multi-beam machines write with an array (or multiple overlapping arrays) of grey-scale pixels. Multi-beam machines write Manhattan shapes as well as curvilinear shapes. Loading effect acts on the curvilinear exposed contours, where some of the loading effect may act in the processing steps prior to etching, and some, or most of it in certain examples, in etching, acting on the curvilinear contours produced by the prior steps. Loading effect and LEC are equally applicable to VSB machines as well as multi-beam machines.

Figure 5:
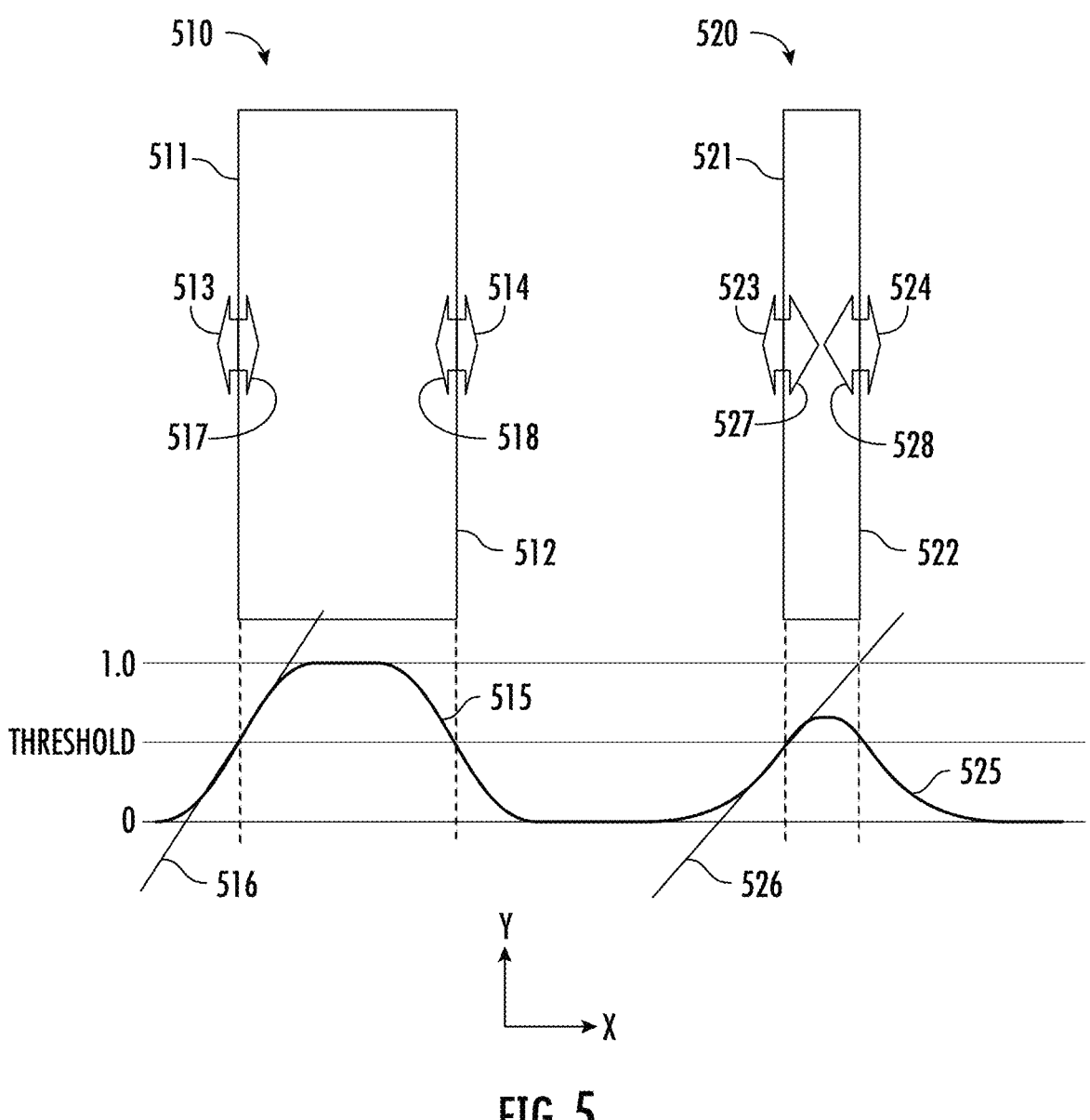
FIG. 5 illustrates dose-based loading effect correction (dLEC) for wide and narrow shapes.
Figure 6:
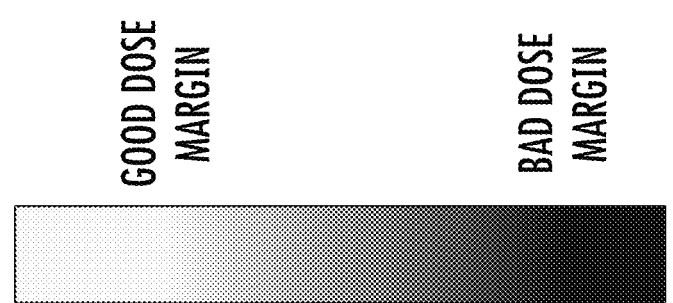
FIG. 6 illustrates dLEC for Manhattan and curvilinear shapes.
Figure 6:
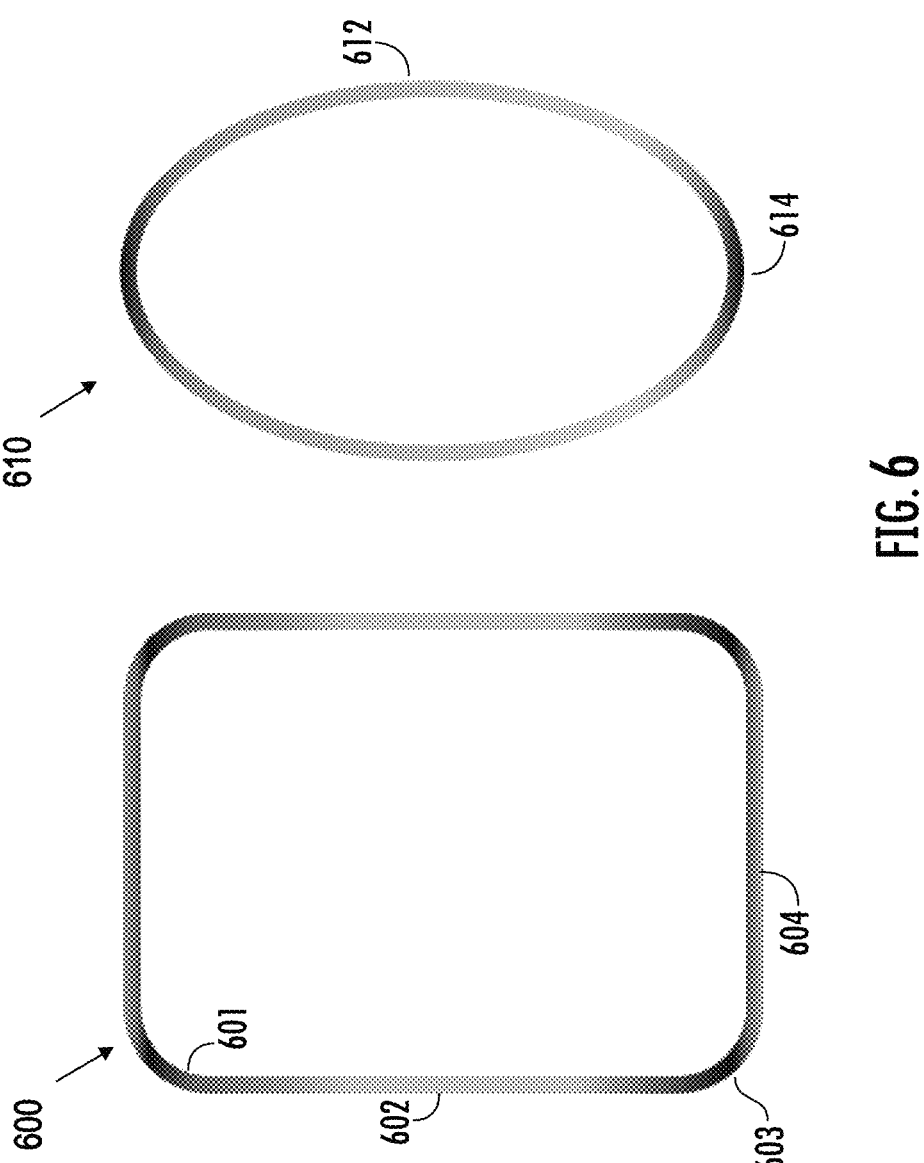

FIG. 5 and FIG. 6 illustrate dose-based loading effect correction (dLEC) and why dLEC produces incorrect results. FIG. 5 illustrates this in the context of line patterns where shapes 510 and 520 are exposed and then etched. Shapes 510 and 520 are rectangles, where shape 520 is narrower than shape 510. FIG. 5 focuses on the left and right edges—left edge 511 and right edge 512 of shape 510 and left edge 521 and right edge 522 of shape 520—that are long enough as compared to the short-range blur radius (or radii) principally of the particle beam and the resist to be void of blurring effects from the top and the bottom edges and the 90-degree corners of shapes 510 and 520. Arrows 513, 514, 523, and 524 represent edge biases that loading effect would apply to the shapes if shapes 510 and 520 remained uncorrected. Arrows 513, 514, 523, and 524 indicate equal amounts of edge biases due to loading effect regardless of the width of shape 520 being much narrower than the width of shape 510 for the large-scale loading correction that is intended by loading effect correction, in this case, dLEC.

Dose plots 515 and 525 reflect plots of the amount of dose applied to the X-axis locations corresponding to the X-axis locations on shape 510 and 520 respectively, after short-range blur due to particle beam blur, resist blur and other sources of short-range blur. The Y-axis of the plots represents the dosage, scaled in this example from 0 to 1.0. Where the dose indicated by plots 515 and 525 crosses the resist threshold, the resist is exposed. Subsequent mask processing steps remove the exposed resist for positive resist, and remove the unexposed resist for negative resist. Either way, etching is applied to the material underneath that is now open and unprotected by the remaining resist. Although there are many different types of etching techniques, in order to etch the material, in effect to dig down into the material, the same etching mechanism at least somewhat etches sideways into the wall of the areas protected by the remaining resist, as represented by arrows 513, 514, 523, and 524, in this example. Loading effect is the difference in the amount of etching that occurs based on the neighborhood open area density of the area exposed for etching in the 1 mm-scale neighborhood. Effectively, there is a given supply of etching material or plasma available, and more open area density dilutes the etching effect, thereby reducing the amount of etching that occurs. Less open area density makes more etching material or plasma available to etch in that neighborhood, thereby increasing the amount of etching that occurs. Whether loading effect is considered to move the edge outwards or inwards for any given edge of a shape is a matter of definition, affected by the assumed threshold, constant bias amount, and other factors.

In FIG. 5, for a positive resist where the shapes 510 and 520 are exposed, the loading effect is assumed to move the edge outwards as indicated by arrows 513, 514, 523, and 524, whose arrows are equal size to represent the nearly constant bias contributed by loading effect in all edges that are within the 1 mm-scale of loading effect. To compensate, LEC needs to be an equal and opposite correction. However, dLEC will move the edges further in for shape for narrow shapes like shape 520 as indicated by arrows 527 and 528, than for shape 510 as indicated by 517 and 518. Now looking at dose plot 515, the dose amount after short-range blur plateaus at near 1.0 dose in this isolated line pattern case. The dose slope 516 at the threshold in dose plot 515 represents how much the edge 511 would move (e.g., how many nanometers) with a small dose change, typically in 0.1% to 5% range. Similarly, dose plot 525 has a dose slope 526 at the threshold, representing how much the edge 521 would move with the small dose change. Dose slope 526 is a shallower slope than dose slope 516 because the width of shape 520 is set to be narrow enough that the short-range blur makes the dose plot 525 not reach 1.0 dose at the peak. A lower dose margin (shallower slope) is worse than a higher dose margin, thus, a given change in dose affects the width of shape 520 more than shape 510. In dLEC, loading effect is corrected by uniformly changing dose for all edges of all shapes in a 10-200 μm scale area. That is, dLEC corrects for loading effect by a percentage dose adjustment per area by density. But a given uniform dose change will have different distance effect (e.g., amount in nanometers) on the edge movement because the dose slope for various shapes is different. For example, the dose slope (also referred to as dose margin or edge slope) at the resist threshold is typically worse for narrow shapes (shallow slope), such that the same percentage dose adjustment will move an edge of a narrow shape more than for a wider shape. Specifically in FIG. 5, the resulting correction indicated by arrows 527 and 528 would move more than the resulting correction indicated by arrows 517 and 518 due to dLEC, as reflected in the different size edge movement shown by the length of arrows 527 and 528 being larger than arrows 517 and 518. This illustration is in the case of a narrow shape, where dose margin is low, but there are many other reasons for dose slope variation of contours of shapes.

FIG. 6 illustrates two examples of edge slope variation along edges of shapes. FIG. 6 includes a contour 600 of a rectangular shape and a contour 610 of an oval shape, where the shading level represents the dose margin at each location along the perimeter of the shape. The figure illustrates that "Manhattan" corners, that have been rounded due to various blurring effects, and sharp curves have poor dose margins, which affects LEC as explained for FIG. 5. The corners of rectangular shapes all have bad (shallow) dose slope, as illustrated by contour 600. In decreasing order of dose slope steepness, dose slope at edge locations 602, 601, 604, then 603 all have different dose slopes. Corners like at location 603 have poor (shallow) dose slope. All sharp corners have bad dose margin, including for a sharp curvature in a curvilinear shape. Contour 610 illustrates that an oval shape has better dose margin at location 612 (on a long side of the oval) than at location 614 (at the short side or ends of the major diameter of the oval). PEC that corrects for proximity effects also significantly affects dose margin. Dense areas will cause PEC to suppress the exposure dose for those areas, making dose slope shallow. Therefore, narrow shapes such as shape 520 in FIG. 5 or curvilinear shapes that have sharp corners in the neighborhood of a large dense area in the length scale of proximity effects, typically in the 10 μm to 30 μm range, would have shallower dose slope. Steep or shallow, if the dose slope was the same everywhere, dLEC would work. The presence of shallow dose slope means there is large variation in dose slope for contour edges across all shapes on the mask, which is the problem with dLEC.

Until about the year 2010, shapes that needed to be printed on the mask were limited to 100 nm in mask dimensions on a side. In fact, one of the two commercial variable shaped beam (VSB) writers at the time limited its VSB size to a minimum size of 100 nm×100 nm without posing a commercial problem.

For those sizes, the resist reaction to the electron beam exposure was not significantly different among the shapes. For example, a given 0.5% change in electron dose would move an edge of a shape by 0.5 nm to 1 nm everywhere nearly equally. The problems were minimal, particularly for small errors of 1 nm or below, because the electron beam being transmitted had a natural blurring radius (roughly of 20-30 nm size), causing a Gaussian distribution of transferred energy beyond the drawn edges of the shapes. The ratio between the minimum size and the blurring radius allowed dLEC to work adequately.

LEC was a function that the mask writers provided to take advantage of this ratio between the minimum size and the blurring radius, by making a correction to a geometric effect using a dose change. Even though the change desired was, say, a 1 nm change everywhere, if a 0.5% change of dose (for example) was known to move the edges by 1 nm everywhere reasonably uniformly, this change in dosage was a good correction mechanism for the loading effect.

In this earlier era, making corrections in the machine and adjusting the corrections per feature edge depending on dose slope was not within the scope of computing possible in the machine as the machine wrote the mask. There was not enough computing power available to consider that possibility. The only feasible correction mechanism then was a dose-based correction applied uniformly to all contour edges within a given area.

With the advent of inline pixel level dose correction (PLDC) for multi-beam mask writing where shapes are biased, adjusted for linearity correction and pixel doses manipulated such as with edge dose enhancement (EDE) to improve uniformity, i.e., to improve resilience to manufacturing variation, manipulating all pixel doses cast by the multi-beam writer has been introduced in production use. PLDC can be applied offline or inline. Inline PLDC computes while the mask writer writes the mask. A method of PLDC is disclosed in U.S. Pat. No. 10,444,629, "Bias Correction for Lithography," which is owned by the assignee of the present application and is hereby incorporated by reference.

Geometric Loading Effect Correction

Methods and systems of the present disclosure advantageously apply a new technique referred to in this disclosure as geometric loading effect correction (gLEC). In gLEC, a correction to counteract loading effect moves an edge of a shape, based on an offset distance that is calculated using a neighborhood open area density. The edge of the shape is adjusted geometrically, by making dosage changes at individual locations along edge. gLEC is equally applicable to masks written by VSB machines or multi-beam machines. gLEC is equally applicable to Manhattan shapes as well as curvilinear shapes or any shapes. gLEC is equally applicable to offline correction as a part of MDP or its subset mask process correction (MPC), and to inline correction such as inline PLDC.

Since approximately 2010, the world has moved to needing much smaller shapes on mask. Now, publications discuss mask shapes that must be 12 nm to 16 nm in width in mask dimensions. Because practical resists for mask making have at best 10 nm sigma of a natural blurring radius now, exposing those small size shapes necessarily makes dose margin bad for these shapes, as shown in FIG. 5. Conventionally, 20-30 nm sigma blur was normal for >100 nm shapes. The difference in shape width to blurring radius ratio between pre-2010 and current mask making is what introduces a new issue that makes dose-based LEC increasingly incorrect going forward.

One other change in the industry makes conventional dose-based analysis of LEC incorrect. That change is the introduction of dose manipulation, for example, for edge dose enhancement. When pixel doses are manipulated for various reasons, the correlation between neighborhood open area density and dose degrades therefore making dose-based analysis incorrect. A more accurate solution can be determined by using geometric analysis to calculate loading effect. But even if the analysis is geometric, dLEC for the calculated loading effect is inaccurate.

Figure 7:
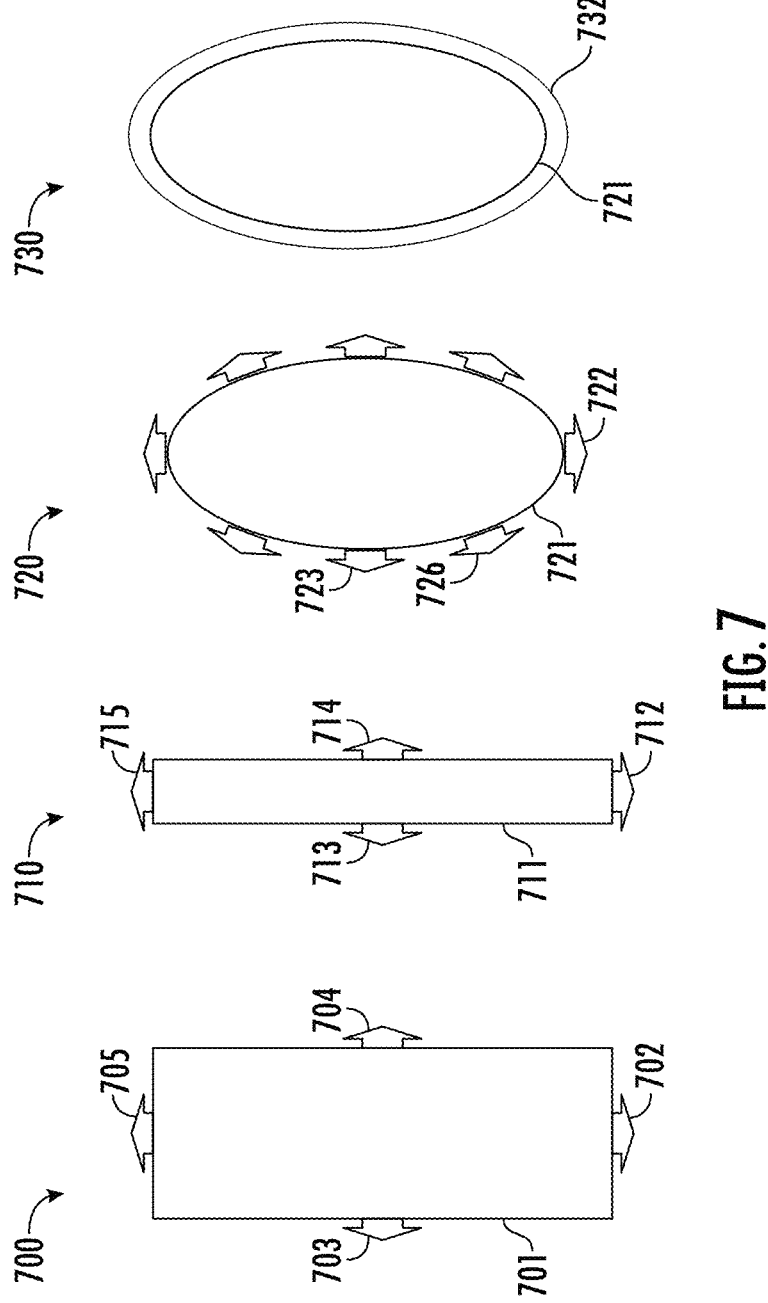
FIG. 7 illustrates geometric loading effect correction (gLEC), in accordance with aspects of the present disclosure.

FIG. 7 demonstrates the effects of constant bias applied by gLEC to various shapes equally along the edges, in accordance with the present disclosure. In these examples, all edges are moved uniformly by a certain amount (e.g., amount of nanometers), where the amount of gLEC bias is determined by area density. Diagrams 700 and 710 are for rectangular shapes, and diagrams 720 and 730 are for oval shapes. Rectangles of all shapes such as in diagrams 700 and 710 in the same loading-effect neighborhood have the contours 701 and 711 biased by the same amounts as 703, 705, 704, and 702 and 713, 715, 714, and 712 (i.e., all around the shapes by equal gLEC amounts). Amounts 703 and 704 are for the long edges of diagram 700; amounts 702 and 705 for the short edges of diagram 700; amounts 713 and 714 for the long edges of diagram 710; and amounts 712 and 715 for the short edges of diagram 710. Diagram 720 illustrates the oval contour 721 being moved by equal gLEC amounts all around the contour, resulting in the biased contour 732 in diagram 730. The amounts are represented, for example, by amount 722 at the end of the major diameter, amount 723 at the end of the minor diameter, and amount 726 at a location between the major and minor diameters. Any shape is biased equally around the contour using gLEC. Thus, using gLEC as disclosed herein, all contour edges are moved (adjusted) by a uniform amount to cancel the size changes that would be caused by loading effects. The uniform amount is achieved by changing dosages along the edge from an initial input dosage. That is, gLEC geometrically adjusts edges by a uniform amount by changing doses (which can be in variable amounts along the edge), whereas conventional techniques adjust dosages by a uniform amount, which can result in non-uniform movement of edges and thus incorrect loading effect correction.

Figure 8:
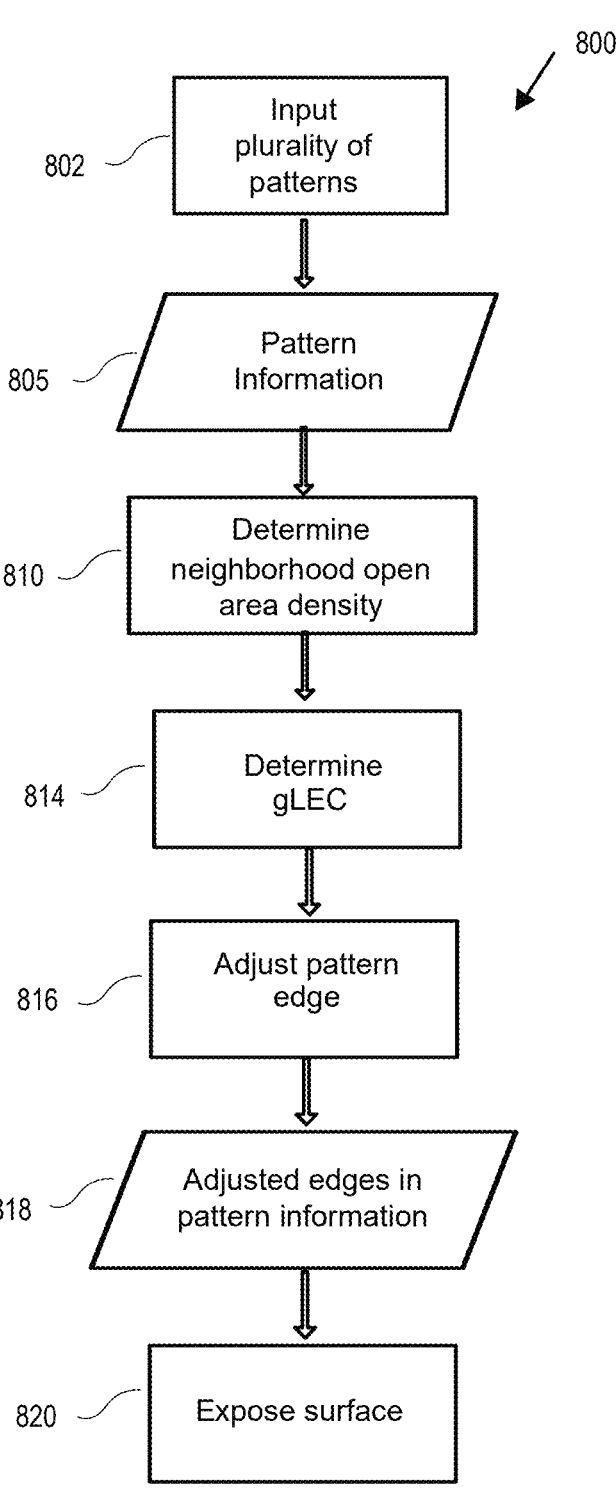
FIG. 8 is a conceptual flow diagram of a method for gLEC, in accordance with aspects of the present disclosure.

FIG. 8 is a conceptual flow diagram of a method 800 for semiconductor manufacturing using gLEC in accordance with the present disclosure. Block 802 involves inputting a plurality of patterns, each pattern in the plurality of patterns comprising a plurality of edges. The output for the plurality of patterns is pattern information 805, which may include information on pattern shapes, pattern locations in the mask, and dosages for each pattern. In one aspect, the plurality of patterns is represented by an array of pixel doses wherein the array of pixel doses represents dosage to be exposed on a surface. Pattern information 805 is examined in block 810 to determine a neighborhood open area density for the plurality of patterns. In one aspect, the neighborhood open area density may be determined by rasterizing the pattern information 805 (i.e., rasterizing a pattern in the plurality of patterns) to a coarse grid. Since loading effect is a 1 mm scale effect, a coarse grid of 10 μm to 100 μm may be appropriate in some examples.

Block 814 involves determining a geometric loading effect correction (gLEC), wherein the geometric loading effect correction comprises a calculated offset from an edge of a pattern in the plurality of patterns, and wherein the calculated offset is determined using the neighborhood open area density. The calculated offset is the loading effect that will occur for that pattern in the plurality of patterns, taking into account the neighborhood open area density as explained in relation to FIG. 4. As an example, a nanometer offset of edges of any given region on the surface, determined using the neighborhood open area density (correlated to but not the same as the electron dose density) is calculated in block 814. The calculated offset may vary for an edge in any given region (i.e., the calculated offset for one shape may be different from that for another shape in another region) and the gLEC is determined as an opposing bias needed to reverse the effect of loading effect. In some aspects, the calculated value for the gLEC is approximately the same magnitude but opposite in direction as the calculated offset that will be caused by loading effect. The correction itself is geometric, though the geometric correction (gLEC) may be performed in the pixel domain or in the geometric domain. In some aspects, the determining of the geometric loading effect correction may be done in a pixel domain.

In some aspects, block 814 for determining gLEC may include calculating a corner rounding, such as for 90-degree corners, where calculating the corner rounding may comprise short-range blur. In some aspects, block 814 for determining gLEC may include calculating a dose margin.

In block 816 the offset is applied to adjust the pattern information by adjusting (relocating) one or more edges of the pattern in the plurality of patterns accordingly, using the gLEC that was determined in block 814. In some aspects, the adjusting the edge comprises changing doses in the array of pixel doses from the input plurality of patterns, where in some cases the changing of doses in the array of pixel doses comprises variable dose changes. In some aspects, in addition to accounting for loading effect, the adjusting the edge of the pattern in block 816 may take into account other correction effects (i.e., biasing techniques) including but not limited to mid-range effect correction, fogging effect correction, proximity effect correction, or any combination thereof. That is, in some aspects, the adjusting varies among different portions of the edge, in which the present gLEC methods may be combined with other biasing techniques such as MEC, FEC and/or PEC.

In some aspects, the adjusting the edge of the pattern in block 816 creates an adjusted edge 818. An output of method 800 is the adjusted edges 818 in the pattern information corrected for loading effect, geometrically. The pattern information including adjusted edge 818 may comprise pixels.

The method 800 may further include block 820 of exposing the surface to form the adjusted edge 818. In some aspects, the surface is a mask for a semiconductor device. In some aspects, the surface is a wafer for a semiconductor device. In some aspects, the exposing the surface is performed by a multi-beam exposure system.

In some aspects, method 800 comprises a method for manufacturing a semiconductor device. The method may include determining the neighborhood open area density for the plurality of patterns, each pattern in the plurality of patterns comprising a plurality of edges. The method may also include determining a geometric loading effect correction, wherein the geometric loading effect correction comprises a calculated offset from an edge of a pattern in the plurality of patterns, and wherein the calculated offset is determined using the neighborhood open area density. The method may further include adjusting the edge of the pattern in the plurality of patterns using the geometric loading effect correction; and forming the adjusted edge on the semiconductor device. In some aspects, the forming of the adjusted edge may involve exposing the pattern having the adjusted edge using an electron beam machine (e.g., a VSB machine or a multi-beam exposure machine), or using another exposure system disclosed herein. In some aspects, the semiconductor device is a mask. In some aspects, the semiconductor device is a wafer.

Figure 9A:
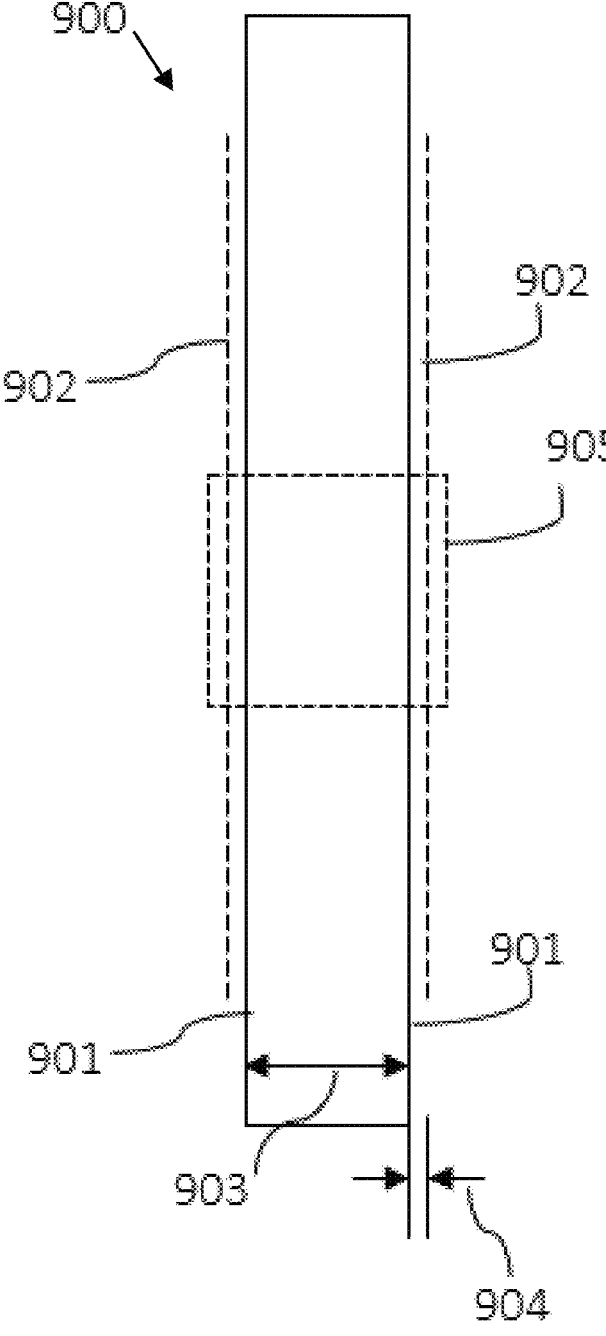
FIGS. 9A-9C illustrate gLEC by adjusting pixel dose for a multi-beam charged particle beam system, in accordance with aspects of the present disclosure.
Figure 9B:
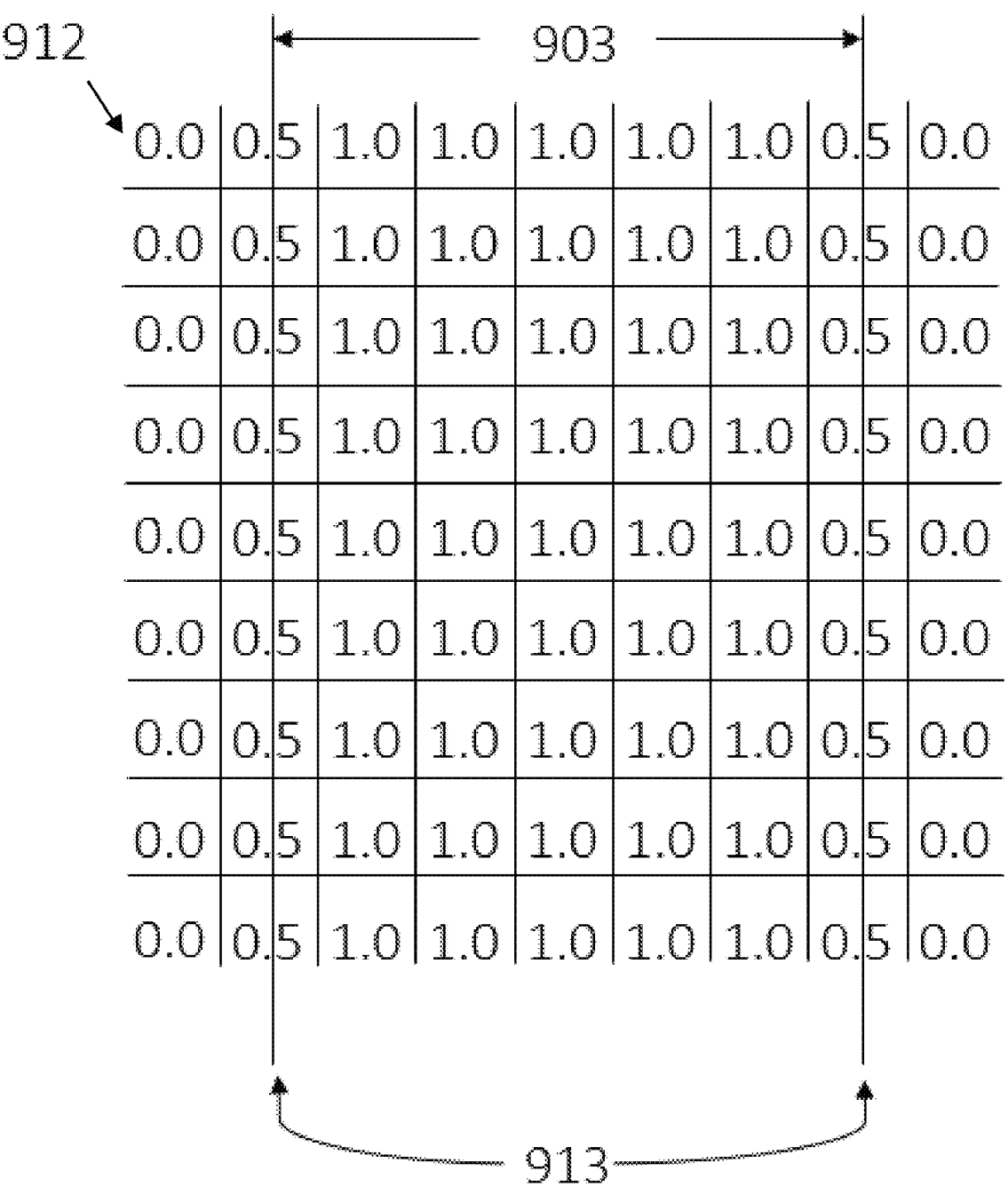
Figure 9C:
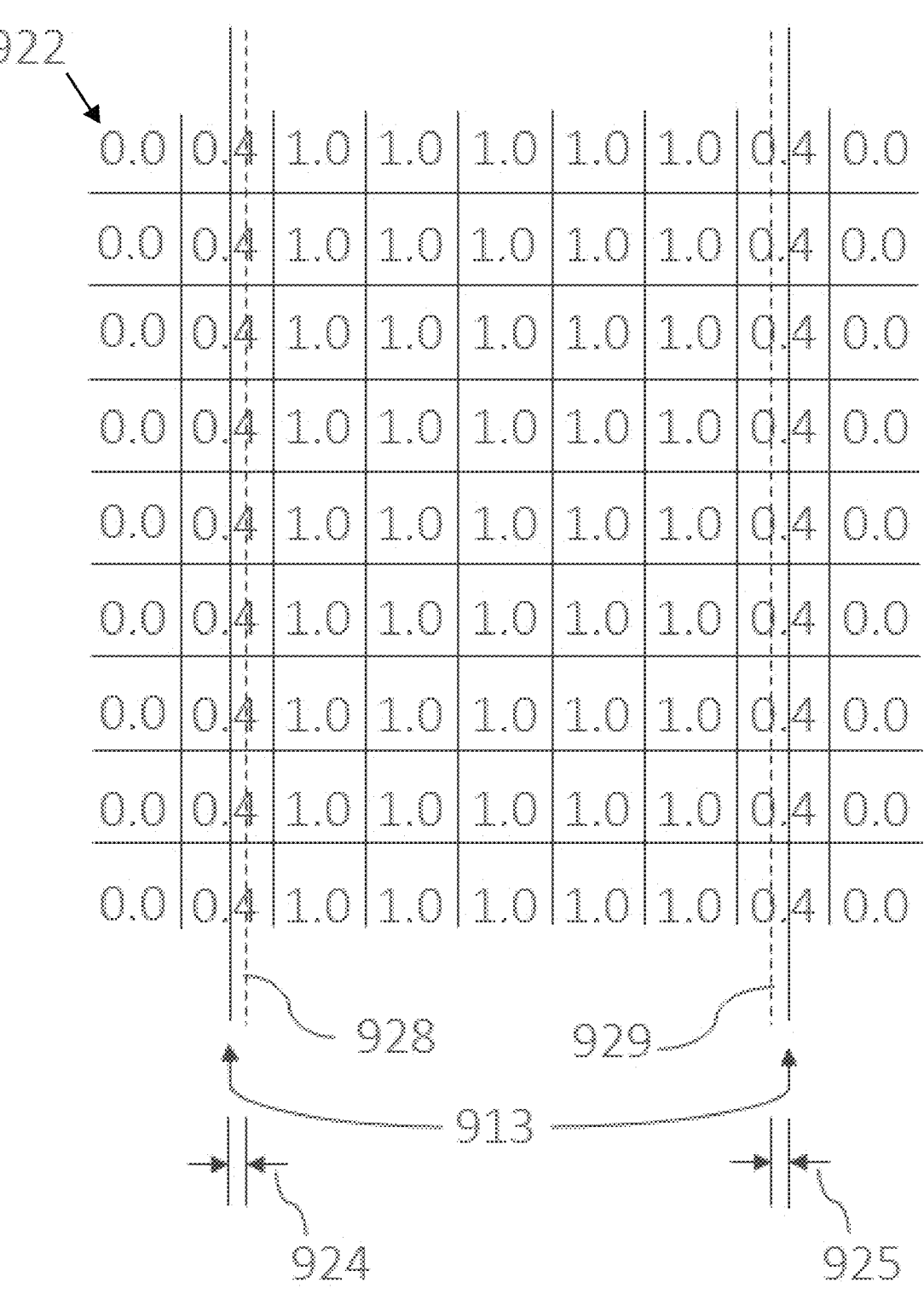

FIGS. 9A-9C demonstrate adjustment of edges for gLEC in a pixel domain. FIG. 9A illustrates a loading effect for a narrow shape 900 that has long edges 901. Shape 900 is a rectangular target pattern as defined in mask design 306 (FIG. 3) shown as its intended width 903 at 60 nm in this example. Loading effect, in this example, causes shape 900 to be etched wider (i.e. edges 901 moving outward), indicated by dashed lines 902. Effects of loading effect, or any biasing effect, on 90-degree corners are complex. The combined effect of biasing from the edges that meet at the corners are deferred to the discussion on FIG. 10A through FIG. 10D. In FIG. 9A, effects on the long edges (dashed lines 902) are described. The objective of LEC is to reverse the offset 904 that is the result of loading effect, where LEC moves edges 901 inward so that offset 904 is canceled out, leaving the post-etch contour at the target width illustrated by edges 901. In some art, the canceling is approximated by applying a bias in the opposite direction of the magnitude of offset 904. In other art, the canceling is more precisely computed, for example taking into account the short-range blur that acts on shape 900, particularly for narrow shapes as compared to the short-range blur radius so that narrower target shapes come out even narrower than intended, and wider target shapes come out wider than intended. Area 905 depicts the area represented in FIG. 9B and FIG. 9C.

FIG. 9B is a dose map 912 for the portion of shape 900 represented by area 905 in FIG. 9A. FIG. 9B illustrates the loading effect for the shape 900 in FIG. 9A, shown with pixel doses as though the shape is to be written by one pass of a multi-beam writer using 10 nm pixels in this example.

The values for each pixel indicate the dose amount for each pixel, where 1.0 indicates 100% dose, 0.0 indicates 0% dose, and 0.5 indicates 50% dose. The percentage represents the relative dose calculated for the mask writer for each pixel or area, not the actual dose cast. Edges 913 indicate the intended (target) width (e.g., 60 nm in this example), the same as edges 901 with width 903 of FIG. 9A.

In FIG. 9C, dose map 922 shows pixel doses after gLEC is applied in the pixel domain. In this example, the pixel doses of 0.5 along edges 913 (same target edges as in FIG. 9B) have been changed to 0.4. Thus in FIG. 9C, the pixel doses reflect edges 913 moving inwards to become edges 928 and 929 to cancel the effect of loading effect. The edges 928 and 929 are adjusted edges compared to edges 913, where the changed dosages from FIG. 9B to FIG. 9C are chosen to achieve the determined geometric loading effect correction, to cancel the offset 904 with offsets 924 and 925. Although the changed doses are all the same in this example (all changed to 0.4 from the initial input dosages of 0.5), in other examples the changed dosages may be different from each other and/or may be changed by a different amount from the input values. Variable changes in dosages may be determined to achieve target shapes, for example, when the initial (input) dosages along an edge are different from each other or for non-linear edges (e.g., corners or curvilinear shapes) in which calculations are more complex.

Figure 9D:
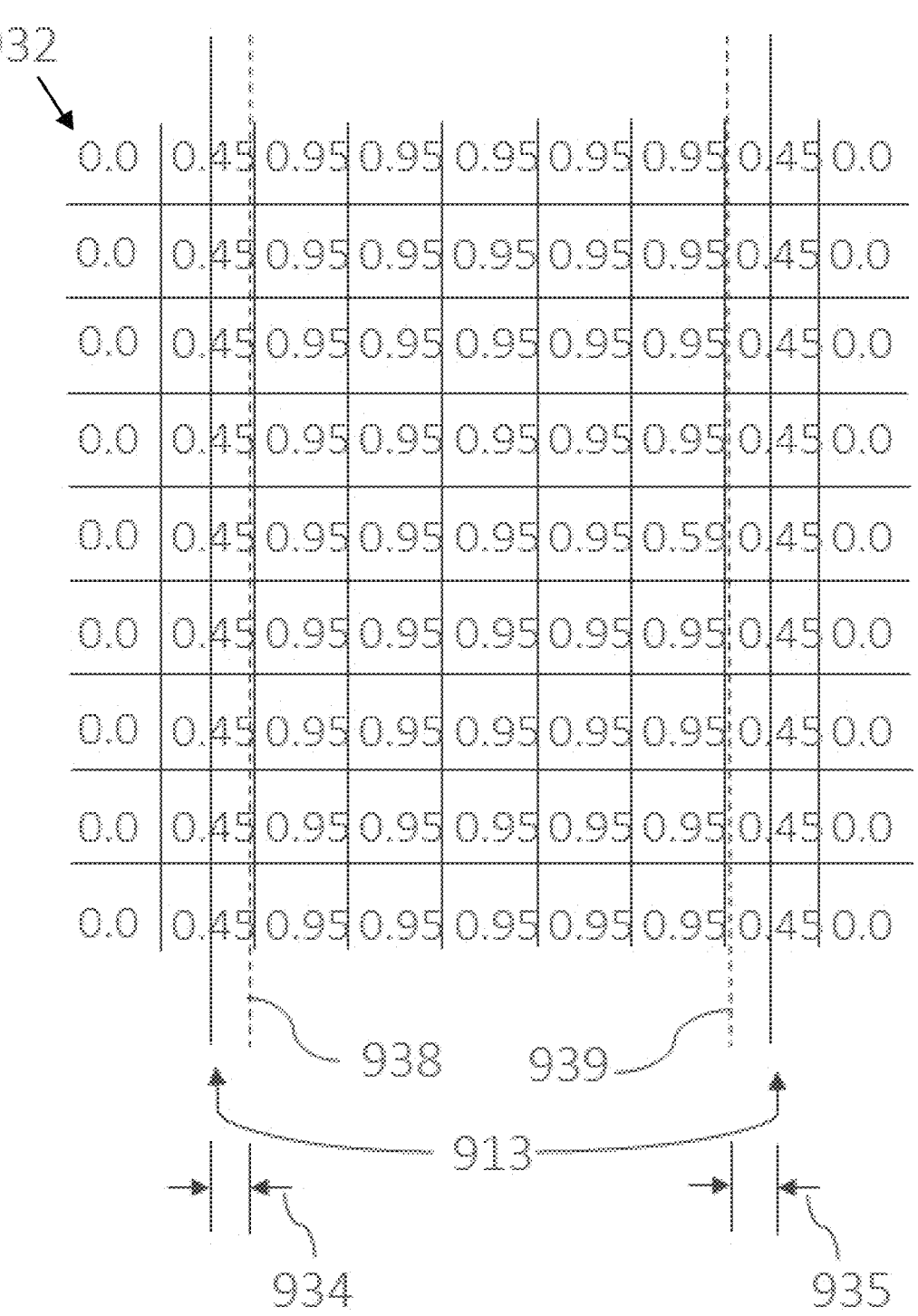
FIG. 9D illustrates dLEC deficiencies.

In FIG. 9D, dose map 932 shows dLEC, where all dose is reduced by a maximum of 5%. In contrast with FIG. 9C, the uniform percentage reduction in dose can result in edges moving by larger offsets 934 and 935 than needed to correct for loading effect. As discussed in FIG. 5, dLEC can over-correct for narrow shapes in this example, and result in edges 913 moving inwards further to become edges 938 and 939 compared to edges 928 and 929 in FIG. 9C.

In one aspect, the present methods apply an opposing offset of the same magnitude as a loading effect on each edge to cancel a loading effect. In another aspect the present methods utilize an understanding that the short-range blur applies to the shapes differently for different width shapes, particularly for narrow shapes, thus simulating and potentially iterating to achieve the effect of accurately canceling the loading effect (e.g., iterating blocks 814 and 816 in FIG. 8). Offsets 924 and 925 in FIG. 9C (distance between target edges 913 and adjusted edges 928 and 929, respectively) represent the amount of gLEC offset applied to cancel out the loading effect on each edge. Since loading effect is a 1 mm-scale effect, edges within nearly 60 nm of each other will likely experience the same loading effect, so offsets 924 and 925 are likely to be nearly equal. The dose map 922 is not adjusted by a multiplier of all doses of the whole dose map as is the case with conventional dose-based LEC. Instead, edges are advantageously moved (i.e., adjusted) as a geometric correction effected by adjusting individual pixel doses. While this example illustrates a correction where edges are moved inwards, edges are adjusted opposingly (which may involve inward or outward movement) to correct for loading effect.

Figures 10A, 10B, 10C, 10D:
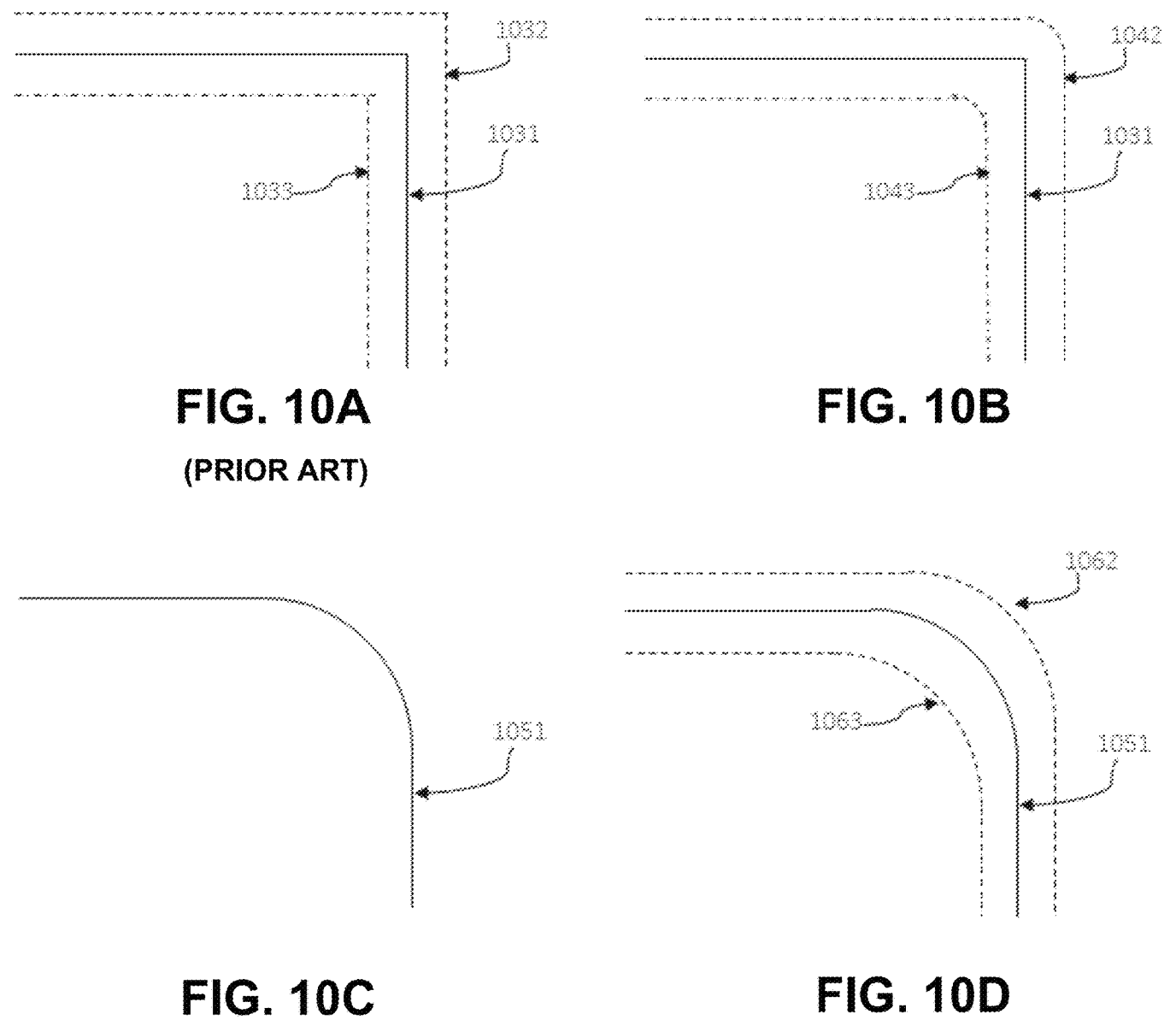

FIGS. 10A-10D describe further details of applying gLEC effectively. FIG. 10A represents polygons where a uniform bias is naively applied to rectilinear shapes that are descriptions of the desired mask shapes in mask design 306. It is known in the art that the 90-degree corners of rectilinear shapes are not manufacturable and become corner-rounded, and have poor dose margin and therefore relatively poor repeatability, i.e., less resilience to manufacturing variation. The conventional methodology has been to use rectilinear shapes to represent mask design 306 (FIG. 3) for a number of reasons, including VSB writing being more practical with rectilinear shapes. Other reasons for using rectilinear shapes include computer-aided design (CAD) infrastructure mostly based on CPU computing without GPU acceleration being more practical with rectilinear shapes, and wafer designs mostly preferring rectilinear shapes. A typical 90-degree corner 1031 of a target mask shape in conventional polygon-based (vs. pixel-based) CAD systems would bias the shape outward as corner 1032, and bias the shape inward as corner 1033. The straight edges of corner 1031 are biased out, then the vertical edge and the horizontal edge are intersected to form the rectilinear shape after biasing. If gLEC was performed using rectilinear shapes as input patterns per these conventional methods, the result will be incorrect as illustrated in FIG. 10B.

FIG. 10B represents an actual effect of loading effect applied equally on the edge of a rectilinear shape, if such a rectilinear shape (corner 1031) was possible to attain on the pattern exposed on the surface prior to etching. Bias as applied by loading effect would in reality result in a rounded corner as shown by contour 1042 for biasing out and as shown by contour 1043 for biasing inward, not the sharp corners 1032 and 1033 of FIG. 10A. Contour 1042 is rounded because etching at the corner etches out the same amount everywhere, which will naturally round the corner after etching. Contour 1043 is rounded because the effect of etching of both edges contribute to etching the corner inwards (at 45 degrees down to the left), effectively "doubling" the effect. The depiction is approximate for illustration purposes only. The contours 1042 and 1043 being rounded, vs. the result of uniformly biasing rectilinear edges as practiced by conventional polygon-based CAD systems as illustrated by corners 1032 and 1033, demonstrate a significant discrepancy in bias assumed by conventional polygon-based CAD systems at corners, even if the bias amount is computed correctly.

For conventional rectilinear designs, the wafer target shapes are also rectilinear shapes where the wafer design is generated with the assumption that only "1D" edges can be reliably manufactured. 1D edges are edges that are straight lines, usually in axis-parallel directions, and are sufficiently far from the ends of the edges which are the corners, often 90-degree corners. Since 90-degree corners on wafers and masks or any surface are known not to be manufacturable, there is a general understanding of the corner rounding that is expected. 1D edges are defined to avoid those corners. As the world turns to manufacture curvilinear shapes on the surface, and even curvilinear shapes on the wafer exposed by a photomask, manufacturing processes can no longer assume that a system designed to manufacture 1D shapes well are sufficient to control manufacturing. While 90-degree corners are common today because conventional designs contain a large number, in the world of curvilinear designs, all edges must be manufactured accurately, not just 1D edges. Effects similar or even worse than that depicted by FIGS. 10A and 10B occur on shape corners and curves of small radius or curvature.

In manufacturing a surface, particle beam exposure blur, resist blur, and other sources of blur affect the shape that is exposed by a particle beam writer. These blurs differ significantly depending on process, and range between a few nm sigma to several tens of nm sigma. In most practical manufacturing of photomasks today, as an example, the radius of the corner rounding that occurs as a result of these short-range blurs are larger than the corner rounding that occurs as a result of conventional biasing as depicted in contours 1042 and 1043. An example is depicted in FIG.

10C as contour 1051, resulting from a mask shape the same as corner 1031 of FIG. 10B. These short-range blur effects and therefore the corner rounding occur on the resist prior to etching. As a result, etching is effectively acting on contour 1051, not on corner 1031.

FIG. 10D demonstrates how uniform distance bias due to loading effect affects the contour 1051 seen by etching, biasing outward as contour 1062 and biasing inward as contour 1063. Because the radius of the combined short-range blur is typically larger than the radius of the corner rounding effect demonstrated in FIG. 10B with contours 1042 and 1043, contours 1062 and 1063 are nearly uniformly biased outwards and inwards from contour 1051, much more so than the difference between contour 1042 from corner 1032 and the difference between contour 1043 from corner 1033. The bias is not exactly uniform along the curve, however, as the effects previously discussed are at play with curvilinear contours, even though the magnitude of the effect is significantly reduced.

FIGS. 10A-10D explain that gLEC in the context of PLDC performs gLEC using curved shapes as a starting point as depicted in FIG. 10D.

Performing the present geometric loading effect corrections inline with the charged particle beam machine (e.g., VSB or multi-beam machine), vs. offline is beneficial in order to minimize the impact on turnaround time (TAT) which is the time it takes a given mask manufacturing process to go from mask design 306 to reticle 324 of FIG. 3. Doing this correction inline has zero TAT impact because the computing happens in parallel with eBeam exposure. Performing this correction offline has some TAT impact. Zero is best. In a multi-beam mask writer, the geometric data that is input to the machine as the target mask to produce is first rasterized to the pixel domain, and then manipulated to different degrees depending on the writer. Given that the time to rasterize and to contour are both extremely computationally expensive operations, in a multi-beam mask writer, it is best to perform the geometric loading effect correction in the pixel-domain.

The present disclosure shall apply to manufacturing patterns using a multi-beam energy source, on any surface such as a mask, wafer, flat panel display (FPD), or FPD mask. The types of energy sources include electron beam (eBeam), proton beam, argon fluoride (ArF) optical laser, multi-frequency lasers (as FPD writers use), and EUV. In multi-beam, a single chamber (often called the column) houses an apparatus that shoots multiple shapes simultaneously either through a single source (e.g., electron gun or light source) or through multiple sources. Multiple shapes may be an array of, for example, 512×512, but can be any number such as ranging from a total of approximately 10 or less, to much more than 512×512. These shapes, which may be squares, are referred to as pixels in this disclosure.

Aspects utilize a multi-beam machine to modify every edge of every shape for the whole mask. This can be done inline within the machine, for example by using graphics processing unit (GPU) acceleration for the computing. Since calculations for many pixels can be done in parallel, special purpose hardware devices may be used to improve performance over general purpose CPUs. In some embodiments, the special purpose hardware device may be a graphical processing unit (GPU).

As described above, in the present methods all the calculations for the offset depend on the neighborhood open area density. To do loading effect correction geometrically using conventional computing techniques, it would first be needed to analyze and combine the various geometric primitives together, to determine the neighborhood open area density. Combining the geometric primitives together is a computationally expensive operation. In contrast, performing the geometric loading effect correction after the geometric data has been rasterized into pixels, as in the present methods, enables the processing to be parallelized. In some aspects, calculations may be performed in real time as an inline process, during the exposure of the surface by a multi-beam exposure system. In other aspects, calculations may be performed during the exposure of another surface, in a pipelined fashion. In a pipelined system, the next surface to be written on the machine is calculated while the previous surface is being written on the machine. A pipelined system is effective for improving the throughput of many surfaces, if the surfaces have similar write times and compute times. An inline (real time) system is effective for improving the throughput as well as the turnaround times of each surface.

The present methods can be used offline, pipelined, or inline. Being fast enough to be able to process inline is desirable. Inline processing is desirable particularly when the number of total pixels that needs to be written is very large. For example, for semiconductor device manufacturing for multi-beam eBeam writing of masks, over 500 T-Bytes of data are required to store all the pixel data. Since multi-beam eBeam machines need to write the pixels extremely quickly, storing such data on hard disk or even solid-state disk may not be practical in cost. In inline processing, unlike in offline or pipelined processing, there is no need to store the data because the machine consumes the data to write the pixels soon after the data is computed. This is another reason why inline processing that the present methods enable is valuable.

The calculations described or referred to in this disclosure may be accomplished in various ways. Due to the large amount of calculations required, multiple computers or processor cores of a CPU may also be used in parallel. In one aspect, the computations may be subdivided into a plurality of 2-dimensional geometric regions for one or more computation-intensive steps in the flow, to support parallel processing. In another aspect, a special-purpose hardware device, either used singly or in multiples, may be used to perform the computations of one or more steps with greater speed than using general-purpose computers or processor cores. Specialty computing hardware devices or processors may include, for example, field-programmable gate arrays (FPGA), application-specific integrated circuits (ASIC), or digital signal processor (DSP) chips. In one aspect, the special-purpose hardware device may be a graphics processing unit (GPU). In another aspect, the optimization and simulation processes described in this disclosure may include iterative processes of revising and recalculating possible solutions. In yet another aspect, calculations may be performed in a correct-by-construction method, so that no iterations are required.

Figure 11:
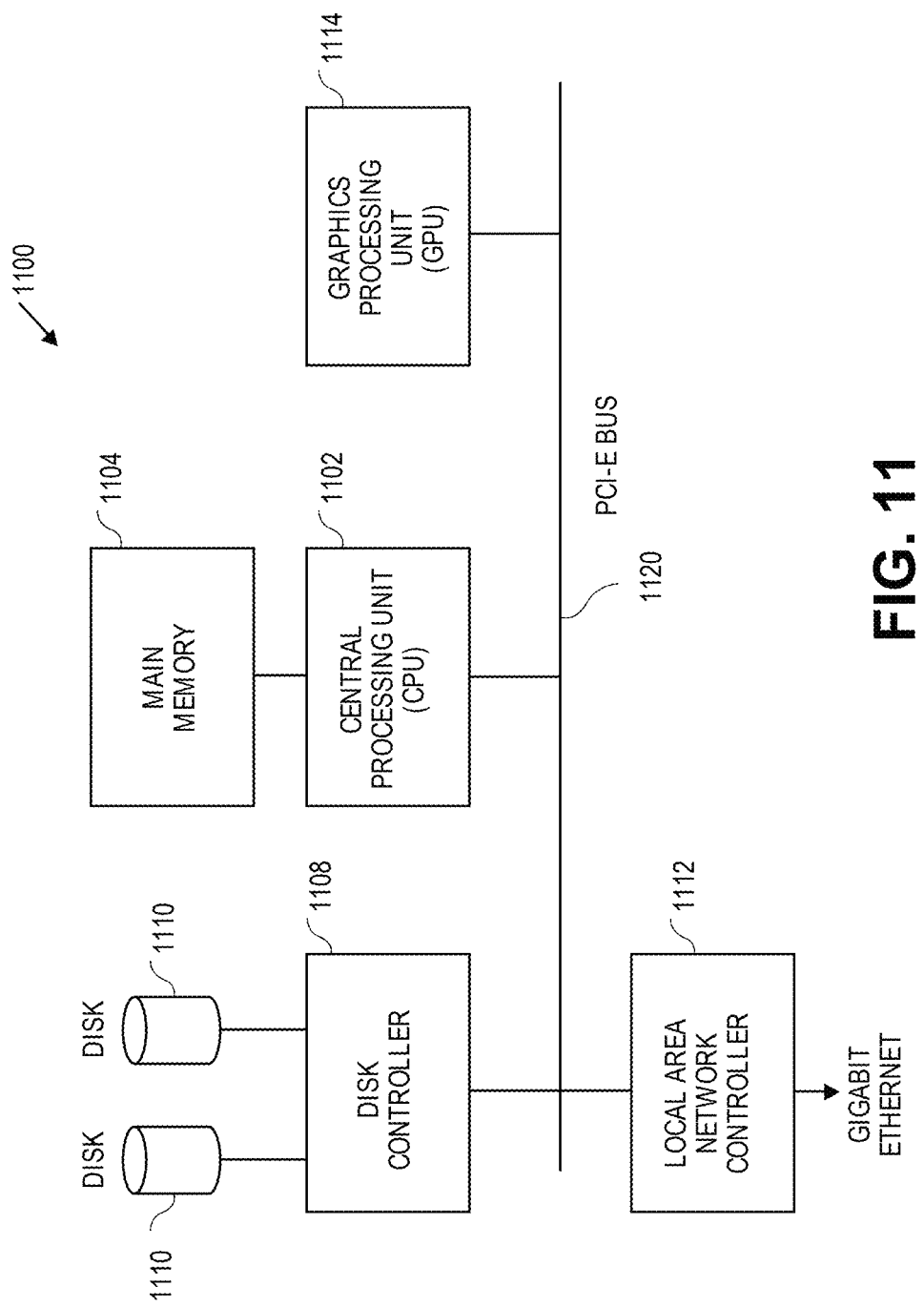
FIG. 11 illustrates a computing hardware device used in accordance with aspects of the present disclosure.

FIG. 11 illustrates an example of a computing hardware device 1100 that may be used to perform the calculations described in this disclosure. Computing hardware device 1100 comprises a central processing unit (CPU) 1102, with attached main memory 1104. The CPU may comprise, for example, eight processing cores, thereby enhancing performance of any parts of the computer software that are multi-threaded. The size of main memory 1104 may be, for example, 64 G-bytes. The CPU 1102 is connected to a Peripheral Component Interconnect Express (PCIe) bus 1120. A graphics processing unit (GPU) 1114 is also connected to the PCIe bus. In computing hardware device 1100, the GPU 1114 may or may not be connected to a graphics output device such as a video monitor. If not connected to a graphics output device, GPU 1114 may be used purely as a high-speed parallel computation engine. The computing software may obtain significantly higher performance by using the GPU for a portion of the calculations, compared to using CPU 1102 for all the calculations. The CPU 1102 communicates with the GPU 1114 via PCIe bus 1120. In other embodiments (not illustrated) GPU 1114 may be integrated with CPU 1102, rather than being connected to PCIe bus 1120. Disk controller 1108 may also be attached to the PCIe bus, with, for example, two disks 1110 connected to disk controller 1108. Finally, a local area network (LAN) controller 1112 may also be attached to the PCIe bus and provides Gigabit Ethernet (GbE) connectivity to other computers. In some embodiments, the computer software and/or the design data are stored on disks 1110. In other embodiments, either the computer programs or the design data or both the computer programs and the design data may be accessed from other computers or file serving hardware via the GbE Ethernet.

Computing hardware device 1100 may be used in a system for semiconductor manufacture for performing gLEC methods of the present disclosure, where the computing hardware device 1100 may be configured to perform one or more actions. In some aspects, a system for semiconductor manufacture comprises a device configured to receive a plurality of patterns, each pattern in the plurality of patterns comprising a plurality of edges; a device configured to determine a neighborhood open area density for the plurality of patterns; a device configured to determine a geometric loading effect correction, wherein the geometric loading effect correction comprises a calculated offset from an edge of a pattern in the plurality of patterns, and wherein the calculated offset is determined using the neighborhood open area density; and a device configured to adjust the edge of the pattern in the plurality of patterns using the geometric loading effect correction. In some aspects, the system may further include 5) a device configured to expose a surface, such as the device being a multi-beam exposure system.

In some aspects, 1) the device configured to receive a plurality of patterns, 2) the device configured to determine the neighborhood open area density, 3) the device configured to determine a geometric loading effect correction, 4) the device configured to adjust the edge of the pattern, and 5) the device configured to expose a surface may all be the same device, or may comprise two or more devices that perform one or more of the functions (actions). For example, one or more devices may be configured to perform any combination of the devices (1), (2), (3), (4) and/or (5).

In some aspects of the present systems, the plurality of patterns is represented by an array of pixel doses and wherein the array of pixel doses represents dosage to be exposed on a surface. In some aspects, the present systems further comprise a device configured to expose a surface by a multi-beam exposure system, wherein the geometric loading effect correction is performed in real time as an inline process during the exposing the surface by the multi-beam exposure system. In some aspects of the present systems, the device configured to determine the geometric loading effect correction uses GPU acceleration.

Reference has been made in detail to aspects of the disclosed invention, one or more examples of which have been illustrated in the accompanying figures. Each example has been provided by way of explanation of the present technology, not as a limitation of the present technology. In fact, while the specification has been described in detail with respect to specific aspects of the invention, it will be appreciated that those skilled in the art, upon attaining an understanding of the foregoing, may readily conceive of alterations to, variations of, and equivalents to these aspects. For instance, features illustrated or described as part of one aspect may be used with another aspect to yield a still further aspect. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method for semiconductor manufacture comprising:
inputting a plurality of patterns, each pattern in the plurality of patterns comprising a plurality of edges;
determining a neighborhood open area density for the plurality of patterns;
determining a geometric loading effect correction (gLEC), wherein the geometric loading effect correction comprises a calculated offset from an edge of a pattern in the plurality of patterns, and wherein the calculated offset is determined using the neighborhood open area density; and
adjusting the edge of the pattern in the plurality of patterns using the geometric loading effect correction to counteract a loading effect, wherein the loading effect is a difference in an amount of etching that occurs based on the neighborhood open area density.

2. The method of claim 1, wherein the plurality of patterns is represented by an array of pixel doses and wherein the array of pixel doses represents dosage to be exposed on a surface.

3. The method of claim 2, wherein the adjusting the edge comprises changing doses in the array of pixel doses from the input plurality of patterns.

4. The method of claim 3, wherein the changing of doses in the array of pixel doses comprises variable dose changes.

5. The method of claim 1, wherein the adjusting the edge of the pattern creates an adjusted edge;
the method further comprising exposing a surface to form the adjusted edge.

6. The method of claim 5, wherein the surface is a mask for a semiconductor device.

7. The method of claim 5 wherein the surface is a wafer for a semiconductor device.

8. The method of claim 5, wherein the exposing the surface is performed by a multi-beam exposure system.

9. The method of claim 1, wherein the determining the gLEC comprises calculating a corner rounding.

10. The method of claim 9, wherein the calculating the corner rounding comprises short-range blur.

11. The method of claim 1, wherein the determining the gLEC comprises calculating a dose margin.

12. The method of claim 1, wherein the adjusting varies among different portions of the edge.

13. A system for semiconductor manufacture comprising:
a device configured to receive a plurality of patterns, each pattern in the plurality of patterns comprising a plurality of edges;
a device configured to determine a neighborhood open area density for the plurality of patterns;
a device configured to determine a geometric loading effect correction, wherein the geometric loading effect correction comprises a calculated offset from an edge of a pattern in the plurality of patterns, and wherein the calculated offset is determined using the neighborhood open area density; and
a device configured to adjust the edge of the pattern in the plurality of patterns using the geometric loading effect correction to counteract a loading effect, wherein the loading effect is a difference in an amount of etching that occurs based on the neighborhood open area density.

14. The system of claim 13, wherein the plurality of patterns is represented by an array of pixel doses and wherein the array of pixel doses represents dosage to be exposed on a surface.

15. The system of claim 13, further comprising a device configured to expose a surface by a multi-beam exposure system, wherein the geometric loading effect correction is performed in real time as an inline process during the exposing the surface by the multi-beam exposure system.

16. The system of claim 13, wherein the device configured to determine the geometric loading effect correction uses GPU acceleration.

17. A method for manufacturing a semiconductor device comprising:
determining a neighborhood open area density for a plurality of patterns, each pattern in the plurality of patterns comprising a plurality of edges;
determining a geometric loading effect correction, wherein the geometric loading effect correction comprises a calculated offset from an edge of a pattern in the plurality of patterns, and wherein the calculated offset is determined using the neighborhood open area density;
adjusting the edge of the pattern in the plurality of patterns using the geometric loading effect correction to counteract a loading effect, wherein the loading effect is a difference in an amount of etching that occurs based on the neighborhood open area density; and
forming the adjusted edge on the semiconductor device.

18. The method of claim 17, wherein the semiconductor device is a mask.

19. The method of claim 17, wherein the semiconductor device is a wafer.

\* \* \* \* \*